US011051429B2

(12) United States Patent
Regnier

(10) Patent No.: US 11,051,429 B2
(45) Date of Patent: *Jun. 29, 2021

(54) THERMALLY CONFIGURED CONNECTOR SYSTEM

(71) Applicant: MOLEX, LLC, Lisle, IL (US)

(72) Inventor: Kent E. Regnier, Lombard, IL (US)

(73) Assignee: Molex, LLC, Lisle, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 16/987,413

(22) Filed: Aug. 7, 2020

(65) Prior Publication Data

US 2020/0367385 A1 Nov. 19, 2020

Related U.S. Application Data

(60) Continuation of application No. 15/876,741, filed on Jan. 22, 2018, now Pat. No. 10,772,237, which is a division of application No. 15/035,532, filed as application No. PCT/US2014/065236 on Nov. 12, 2014, now Pat. No. 9,877,413.

(60) Provisional application No. 61/903,097, filed on Nov. 12, 2013.

(51) Int. Cl.
*H01R 13/00* (2006.01)
*H05K 7/20* (2006.01)
*G02B 6/42* (2006.01)
*H01R 13/633* (2006.01)

(52) U.S. Cl.
CPC ....... *H05K 7/20418* (2013.01); *G02B 6/4269* (2013.01); *G02B 6/4284* (2013.01); *H01R 13/6335* (2013.01)

(58) Field of Classification Search
CPC ............ H01R 13/6335; H05K 7/20418; G02B 6/4269; G02B 6/4284
USPC .................................................. 439/481, 487
See application file for complete search history.

(56) References Cited

U.S. PATENT DOCUMENTS

| 2,965,819 A | 12/1960 | Rosenbaum |
| 2,984,774 A | 5/1961 | Race |
| 3,320,498 A | 5/1967 | Evans |
| 4,669,028 A | 5/1987 | Faa, Jr. |
| 5,167,531 A * | 12/1992 | Broschard, III ..... H01R 13/658 439/541.5 |

(Continued)

FOREIGN PATENT DOCUMENTS

| CN | 202059724 U | 11/2011 |
| JP | 2001-244664 A | 9/2001 |

(Continued)

OTHER PUBLICATIONS

Notification of Reasons for refusal received for JP application No. 2018-213932, dated Feb. 4, 2020, 6 pages. (3 pages of English translation and 3 pages of official copy).

(Continued)

*Primary Examiner* — Abdullah A Riyami
*Assistant Examiner* — Vladimir Imas

(57) ABSTRACT

A connector system with improved thermal management is provided. Various receptacles are provided that include features which may enhance air flow, and therefore cooling. Thermal channel features in the receptacle cage and/or housing allow air passing through the receptacle to directly remove thermal energy from components within and carry the thermal energy out of the cage.

6 Claims, 48 Drawing Sheets

(56) References Cited

U.S. PATENT DOCUMENTS

| | | | |
|---|---|---|---|
| 5,391,090 A | 2/1995 | Power | |
| 5,740,013 A | 4/1998 | Roesner et al. | |
| 5,781,682 A * | 7/1998 | Cohen | G02B 6/4277 |
| | | | 385/89 |
| 5,797,770 A * | 8/1998 | Davis | H01R 13/658 |
| | | | 439/607.27 |
| 5,960,141 A | 9/1999 | Sasaki et al. | |
| 6,104,611 A | 8/2000 | Glover et al. | |
| 6,137,158 A * | 10/2000 | Cohen | G02B 6/4249 |
| | | | 257/666 |
| 6,349,029 B1 | 2/2002 | Leman et al. | |
| 6,349,035 B1 | 2/2002 | Koenen | |
| 6,406,192 B1 | 6/2002 | Chen et al. | |
| 6,421,240 B1 | 7/2002 | Patel | |
| 6,533,470 B2 * | 3/2003 | Ahrens | G02B 6/4292 |
| | | | 385/135 |
| 6,712,621 B2 | 3/2004 | Li et al. | |
| 6,780,053 B1 | 8/2004 | Yunker et al. | |
| 6,994,584 B1 | 2/2006 | Santana, Jr. et al. | |
| 7,090,523 B2 | 8/2006 | Shirk et al. | |
| 7,106,595 B2 | 9/2006 | Foster, Sr. et al. | |
| 7,229,221 B2 | 6/2007 | Ahrens | |
| 7,277,281 B1 | 10/2007 | Lu et al. | |
| 7,281,862 B2 | 10/2007 | Oen et al. | |
| 7,281,864 B2 | 10/2007 | Mizue et al. | |
| 7,463,495 B2 | 12/2008 | Tanaka et al. | |
| 7,480,147 B2 | 1/2009 | Hoss et al. | |
| 7,524,206 B2 | 4/2009 | Gutierrez et al. | |
| 7,660,114 B2 | 2/2010 | Watanabe et al. | |
| 7,708,583 B2 | 5/2010 | Ma | |
| 7,764,504 B2 | 7/2010 | Phillips et al. | |
| 7,779,960 B2 | 8/2010 | Tang et al. | |
| 7,817,426 B2 | 10/2010 | Tamori | |
| 7,821,785 B1 | 10/2010 | Neumann | |
| 7,826,232 B2 * | 11/2010 | Von Arx | H01R 13/514 |
| | | | 361/788 |
| 8,081,470 B2 | 12/2011 | Oki et al. | |
| 8,109,321 B2 | 2/2012 | Alousi et al. | |
| 8,123,573 B2 | 2/2012 | Takehara et al. | |
| 8,197,282 B1 | 6/2012 | Su et al. | |
| 8,289,690 B2 | 10/2012 | Chang et al. | |
| 8,393,917 B2 | 3/2013 | Regnier | |
| 8,976,525 B2 | 3/2015 | de Bock et al. | |
| 9,088,094 B2 | 7/2015 | Iyer et al. | |
| 9,352,380 B2 | 5/2016 | Wu | |
| 9,716,347 B2 * | 7/2017 | Kachlic | G02B 6/4284 |
| 2001/0028550 A1 * | 10/2001 | Miyake | H05K 7/20581 |
| | | | 361/695 |
| 2003/0063865 A1 | 4/2003 | Holmquist | |
| 2003/0171033 A1 | 9/2003 | Bright et al. | |
| 2004/0264137 A1 | 12/2004 | Trautman et al. | |
| 2005/0255726 A1 | 11/2005 | Long | |
| 2006/0003628 A1 | 1/2006 | Long et al. | |
| 2006/0003632 A1 | 1/2006 | Long | |
| 2006/0160409 A1 | 7/2006 | Shimizu et al. | |
| 2006/0219852 A1 | 10/2006 | Kawai et al. | |
| 2006/0221573 A1 | 10/2006 | Li | |
| 2006/0256515 A1 | 11/2006 | Watanabe | |
| 2006/0291172 A1 | 12/2006 | Lee et al. | |
| 2007/0139897 A1 | 6/2007 | RaghuRam | |
| 2007/0167055 A1 | 7/2007 | Watanabe | |
| 2007/0291450 A1 | 12/2007 | Watanabe | |
| 2008/0285236 A1 | 11/2008 | Phillips et al. | |
| 2009/0298349 A1 * | 12/2009 | Filipon | H01R 13/6658 |
| | | | 439/669 |
| 2010/0254662 A1 | 10/2010 | He et al. | |
| 2012/0058670 A1 | 3/2012 | Regnier et al. | |
| 2012/0155108 A1 | 6/2012 | Scholeno | |
| 2012/0196477 A1 | 8/2012 | Nichols et al. | |
| 2013/0164970 A1 | 6/2013 | Regnier et al. | |
| 2014/0328563 A1 | 11/2014 | DeMeritt et al. | |
| 2016/0149324 A1 * | 5/2016 | Regnier | H01R 12/721 |
| | | | 439/76.1 |

FOREIGN PATENT DOCUMENTS

| | | |
|---|---|---|
| JP | 2001-296458 A | 10/2001 |
| JP | 2004-303450 A | 10/2004 |

OTHER PUBLICATIONS

Notification of Reasons for refusal received for JP application No. 2016-529895, dated Aug. 30, 2017, 12 pages. (6 pages of English translation and 6 pages of official copy).

First Office action and search report for CN application No. 2016-529895, dated Dec. 2, 2016, 6 pages. (3 pages of English translation and 3 pages of official copy).

International search report and written opinion received for PCT application No. PCT/US2014/065236, dated Feb. 13, 2015, 9 pages.

Non-final office action received for U.S. Appl. No. 15/876,741, dated Nov. 14, 2019, 8 pages.

Non-final office action received for U.S. Appl. No. 15/035,532, dated Apr. 24, 2017, 11 pages.

Office Action received for JP Application No. 2018-213932, dated Apr. 13, 2021, 8 Pages. (4 Pages of English Translation and 4 Pages of Official Notification).

* cited by examiner

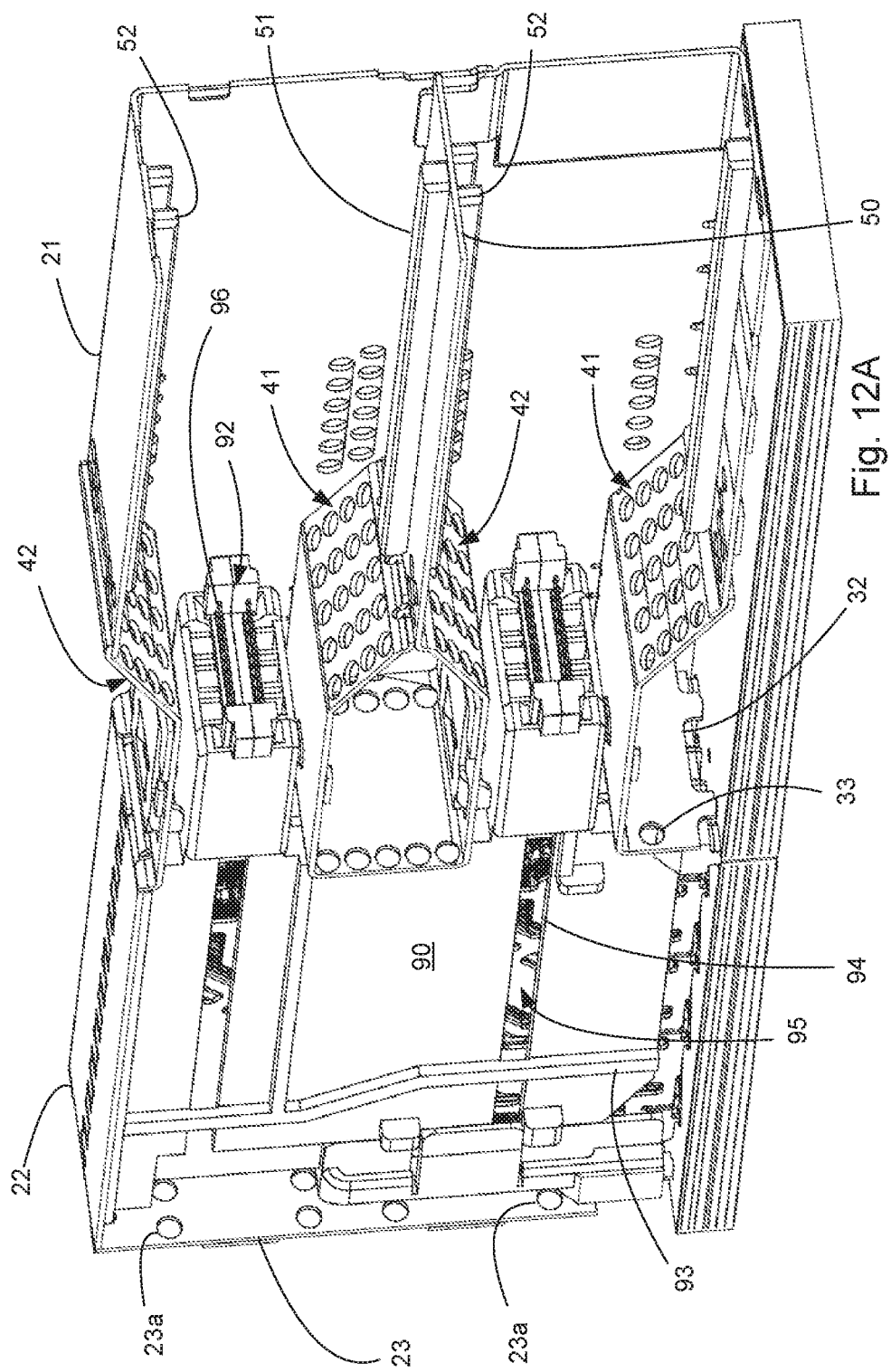

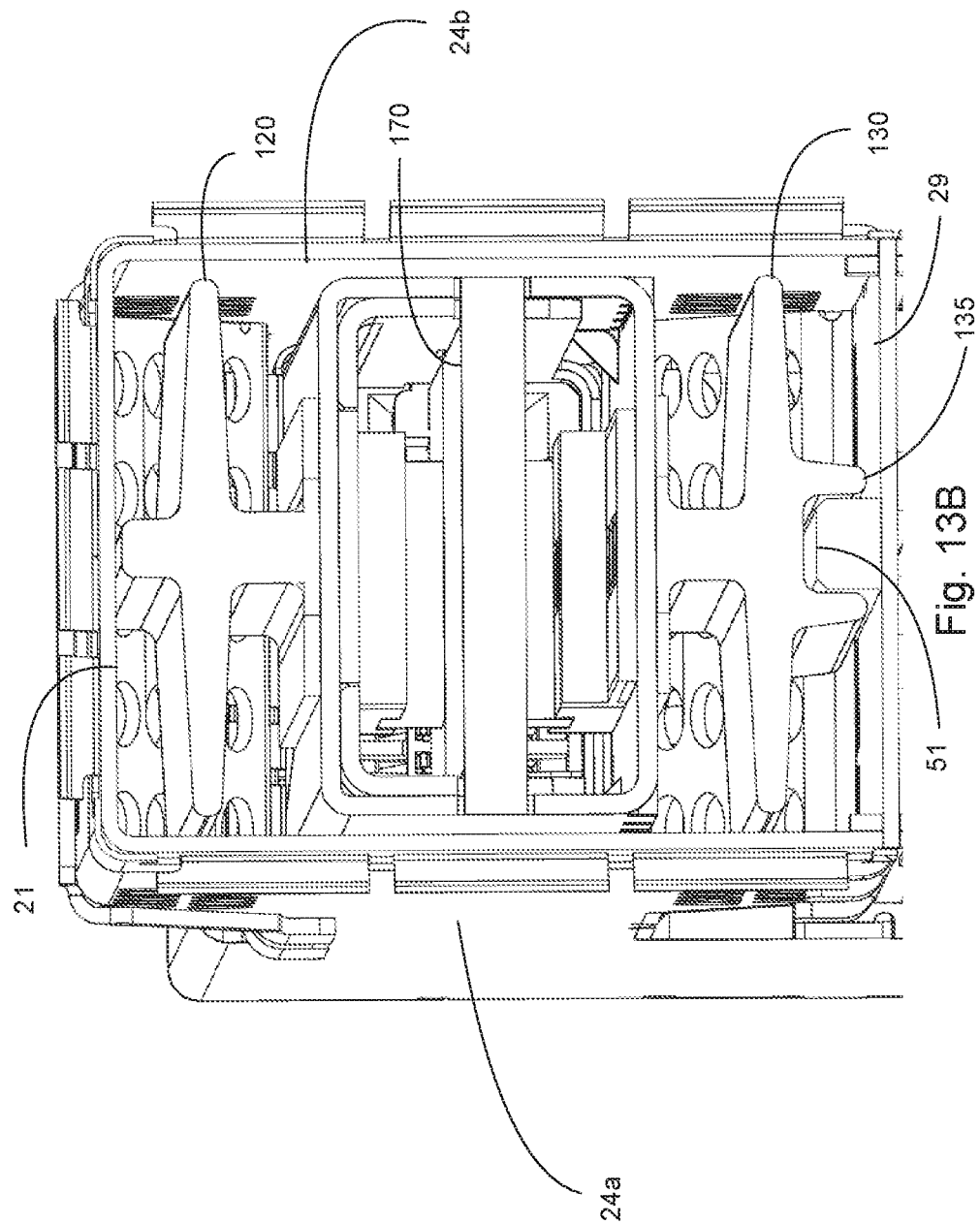

THERMALLY CONFIGURED CONNECTOR SYSTEM

RELATED APPLICATIONS

This application claims priority to U.S. application Ser. No. 15/876,741, filed Jan. 22, 2018, which in turn claims priority to U.S. application Ser. No. 15/035,532, filed May 10, 2016, now U.S. Pat. No. 9,877,413, which is a national phase of PCT Application No. PCT/US2014/065236, filed Nov. 12, 2014, which in turn claims priority to U.S. Provisional Application No. 61/903,097, filed Nov. 12, 2013, all of which are incorporated herein by reference in their entirety.

TECHNICAL FIELD

This disclosure relates to the field of connectors, more specifically to connector systems suitable to manage thermal energy.

DESCRIPTION OF RELATED ART

As data rates have increased, powered cable assembles have become increasingly important. At lower signaling frequencies, it often was sufficient to use active cable assemblies. However, as data rates have increased it has become increasingly necessary to use optical systems due to the much lower levels of signal attenuation that occurs in an optical medium versus a copper medium. As data rates reach 25 Gbps per channel, distances above ten meters tend to be handled by optical modules (and possibly distances above 3-5 meters). For those optical cable assemblies, each end of the optical cable assembly is connector module that includes a heat generating electro-optical system that converts received electrical signals into optical signals and converts received optical signals into electrical signals. Depending on the configuration of optical cable assembly, the optical modules can be integral with the optical cable or the optical modules can be configured with a first optical connector that is configured to accept a second optical connector provided on the optical cables.

Regardless of the connector module configuration, such conversion takes energy and produces waste thermal energy that needs to be managed. Initially such connectors were relatively expensive and therefore the number of ports that might be provided on a box (which could be a switch, a server or some other device configured to handle the data) was limited. However, advances in the electro-optical system have allowed for more cost effective and efficient optical modules and consequentially it is more desirable to create box with a larger number of ports.

Even with the efficiency improvements, however, there is still substantial thermal energy to manage. Therefore, it is necessary to provide a connector system that can facilitate removal of waste thermal energy. One method that has been used in the past is to provide a receptacle with a housing positioned in a cage, the cage and housing providing a port to receive a module. The cage includes an opening on the top and a heat sink is positioned in that opening. The heat sink positioned on top of the cage is biased into the port such that when a module is inserted into the port, the heat sink presses against the top surface of the module and provides a mechanism for dissipating the thermal energy generated by the module.

Unfortunately, such heat sink systems, which are often referred to as riding heat sinks, tend to be relatively inefficient at heat transfer due to the need to have the heat sink slide over the top of the module during insertion (thus providing a less desirable thermal interface between the heat sink and the module). Given the need to have acceptable insertion forces, it has been accepted that there is little that can be done to a riding heat sink to improve this thermal interface.

Another method of dissipating the thermal energy was provided in the design disclosed in U.S. Publication No. 2013-0164970, which illustrates the use of fingers to couple a module to a thermal transfer plate. Such a thermal solution can reduce the thermal resistance between the module and a heat sink and also is suitable for stacked configurations. However, further improvements would be desirable, particularly if additional port density is desired. Consequentially, certain individuals would appreciate further improvements in a connector system.

SUMMARY

A connector system is provided that includes a cage that is positioned around a connector housing and can provide two stacked ports. The cage is configured with openings that allow air to flow through the ports and includes exhaust apertures in back of the port. A module is provided with a shell and includes an energy consumption device thermally coupled to an integral heat sink that extends outside the shell. Air can flow in through the front of the port, pass over the heat sink and then exit out the exhaust apertures. Thus, the connector system provides a more efficient way to transmit thermal energy to the heat sink and allows for the thermal energy to be removed, even in a ganged and stacked connector system.

BRIEF DESCRIPTION OF THE DRAWINGS

The present invention is illustrated by way of example and not limited in the accompanying figures in which like reference numerals indicate similar elements and in which:

FIG. 12A illustrates a perspective view of a cross-section of FIG. 11, taken along line 12-12.

FIG. 13B illustrates a perspective view of a cross-section of another embodiment of a module inserted in a port

DETAILED DESCRIPTION

Figure 1:
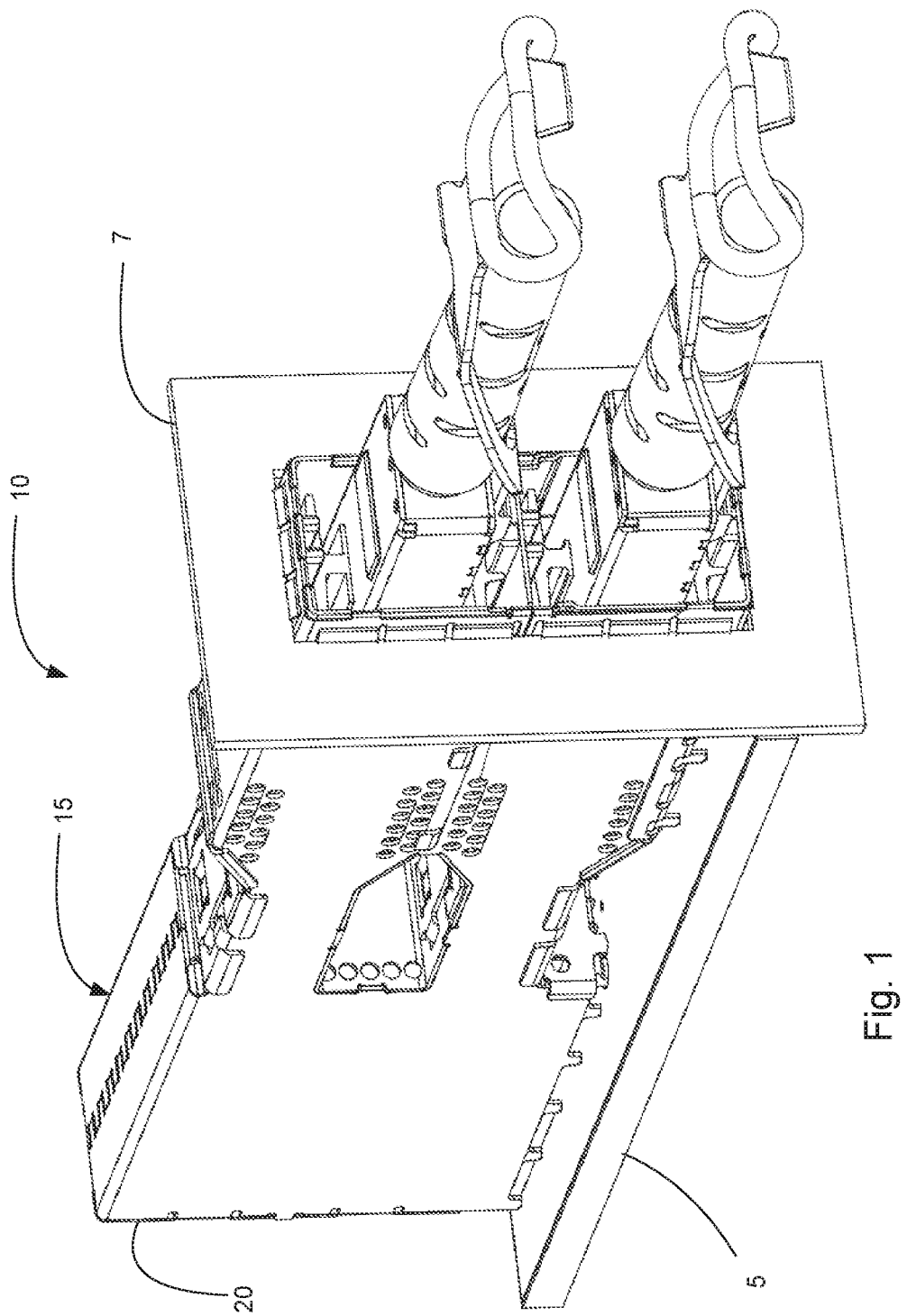
FIG. 1 illustrates a perspective view of an embodiment of a connector system.
Figure 2:
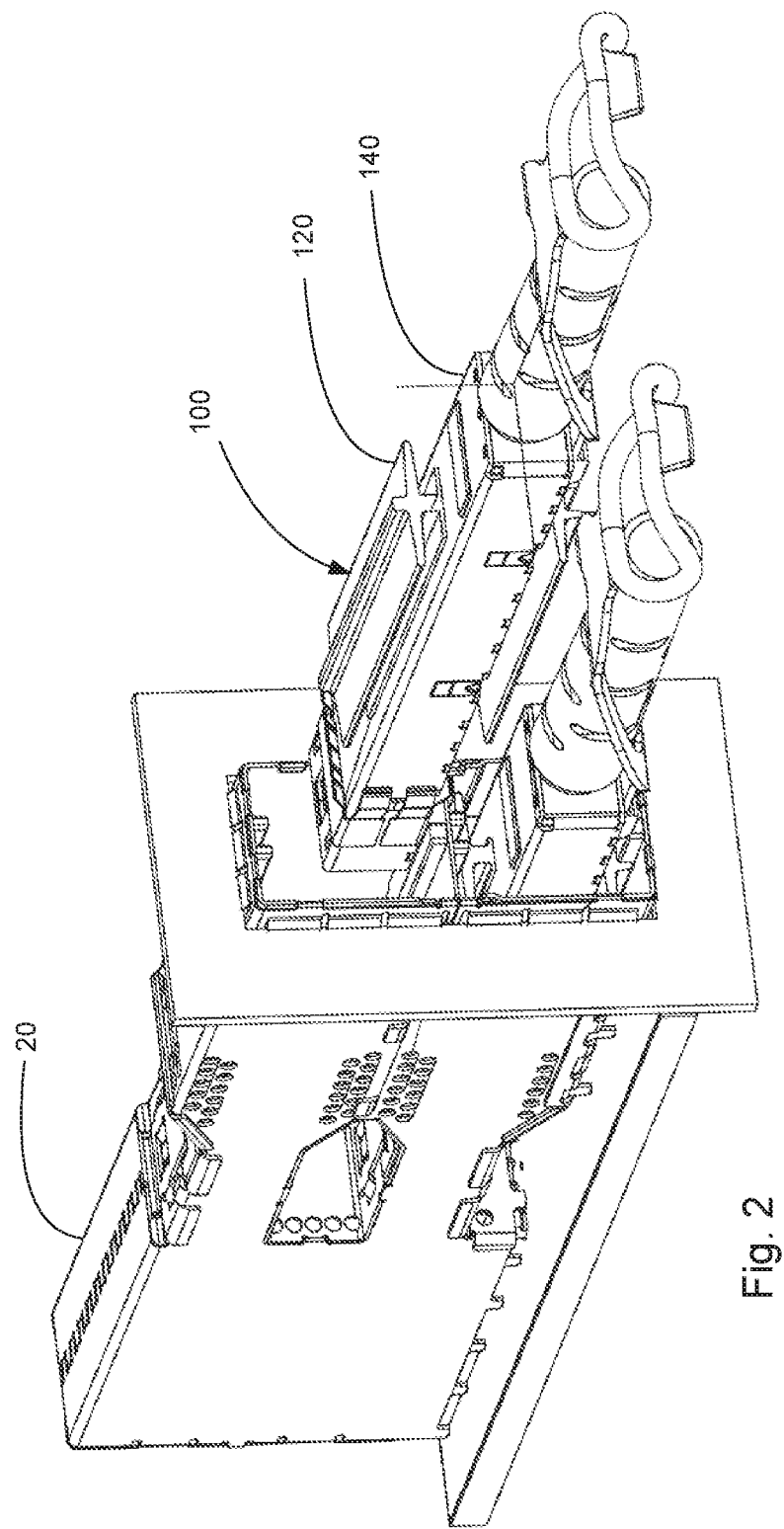
FIG. 2 illustrates a partially exploded perspective view of an embodiment of a connector system.
Figure 3:
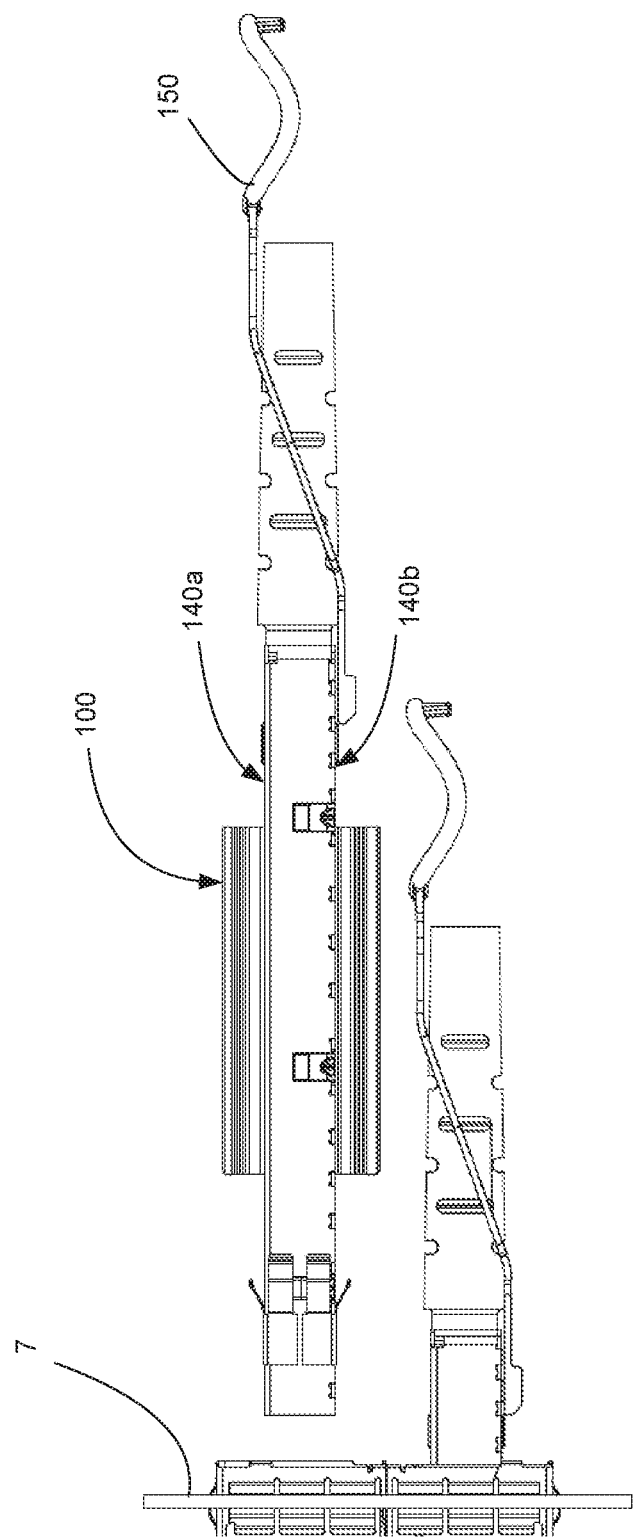
FIG. 3 illustrates a partial elevated side view of embodiment depicted in FIG. 2.
Figure 4:
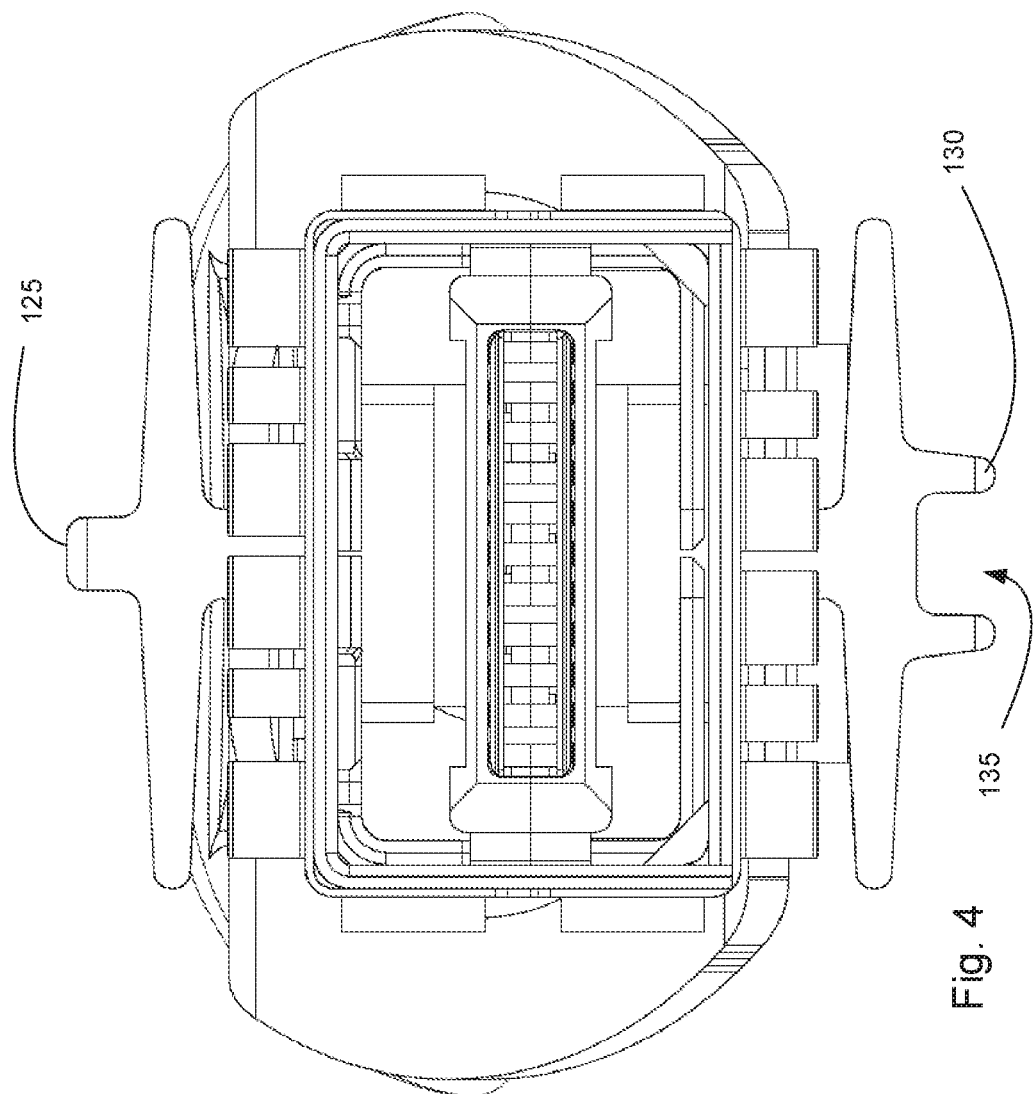
FIG. 4 illustrates an elevated front view of an embodiment of a module.
Figure 5:
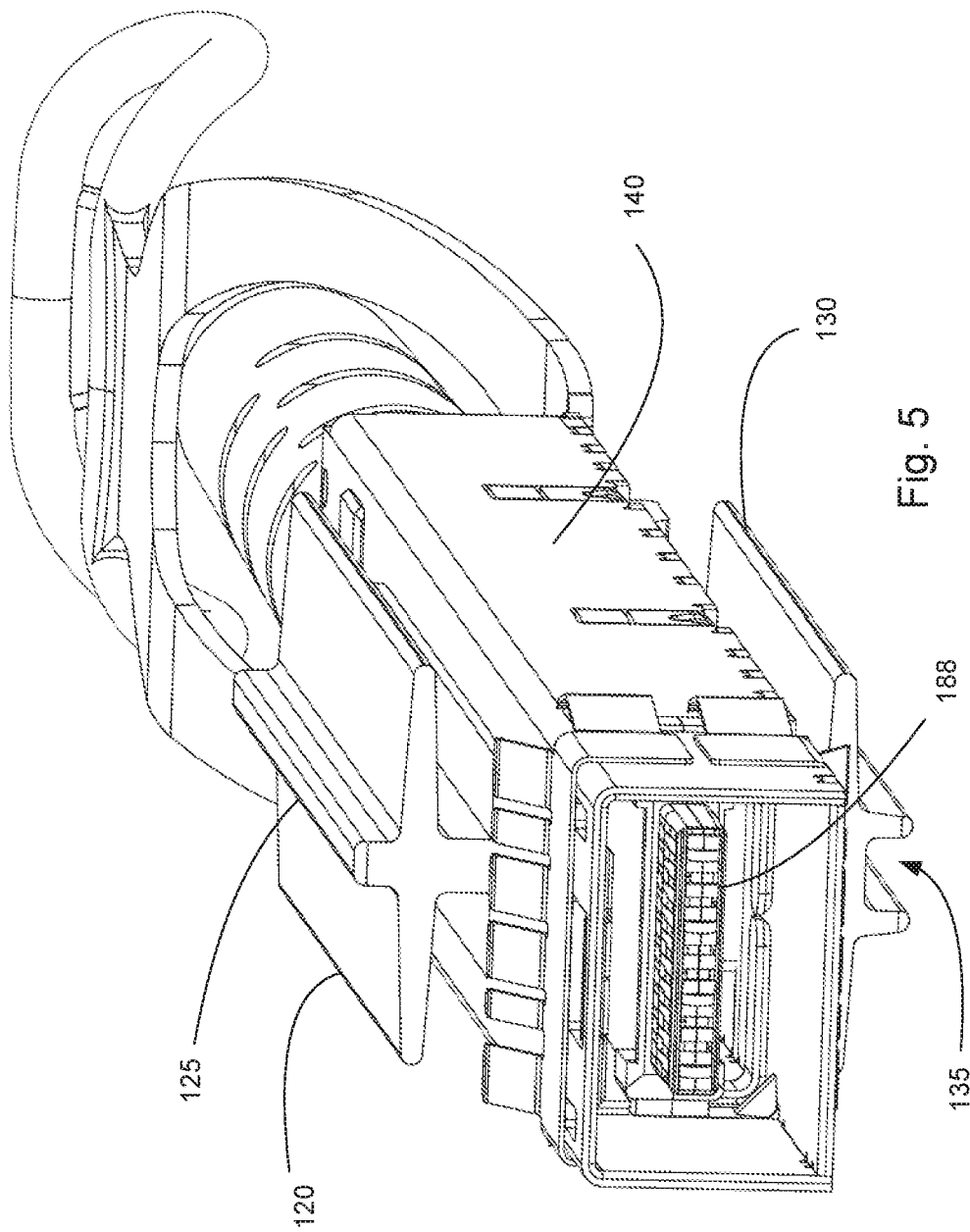
FIG. 5 illustrates a perspective view of the embodiment depicted in FIG. 4.
Figure 6:
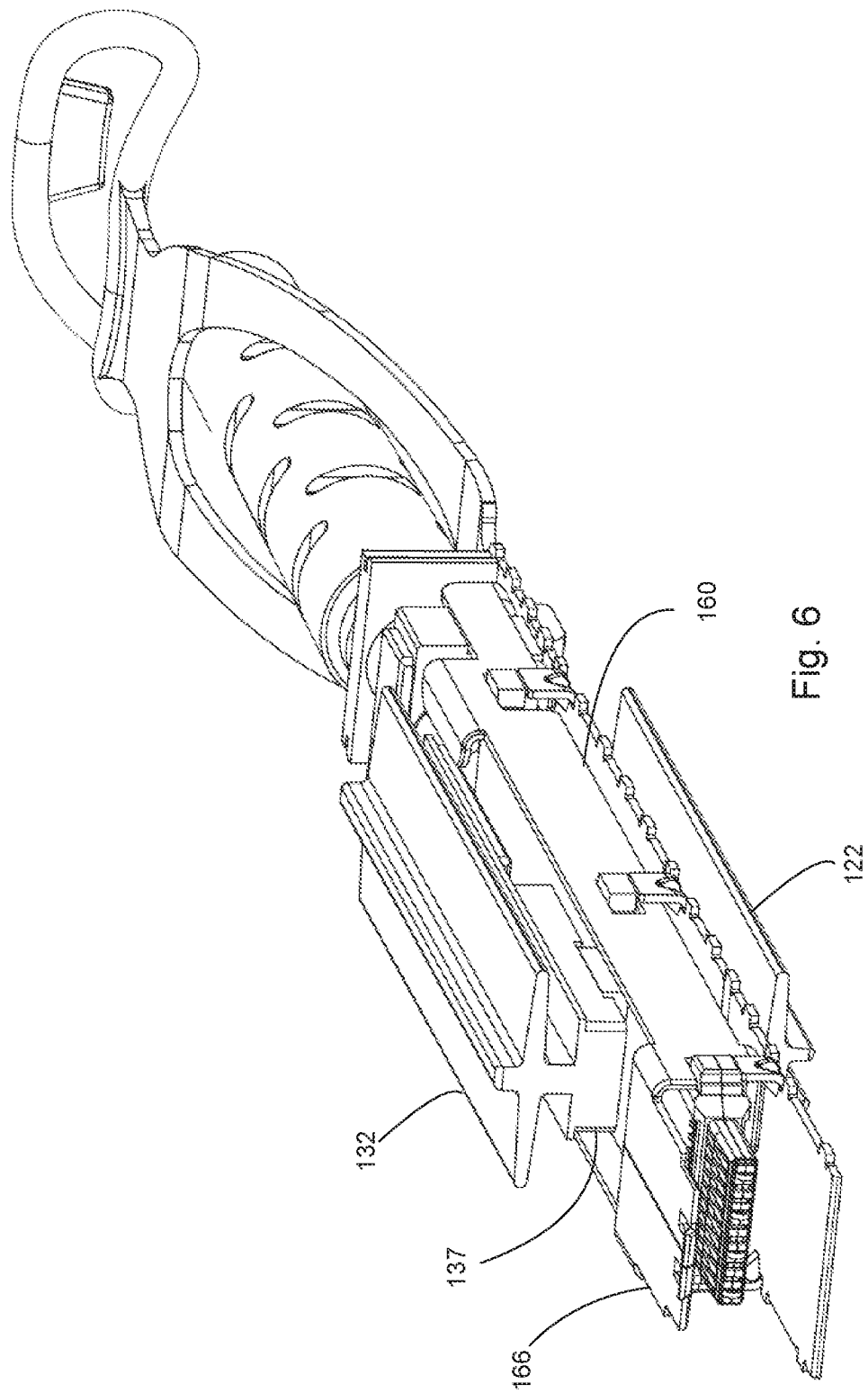
FIG. 6 illustrates a simplified perspective view of embodiment depicted in FIG. 5 with the body partially removed.
Figure 7:
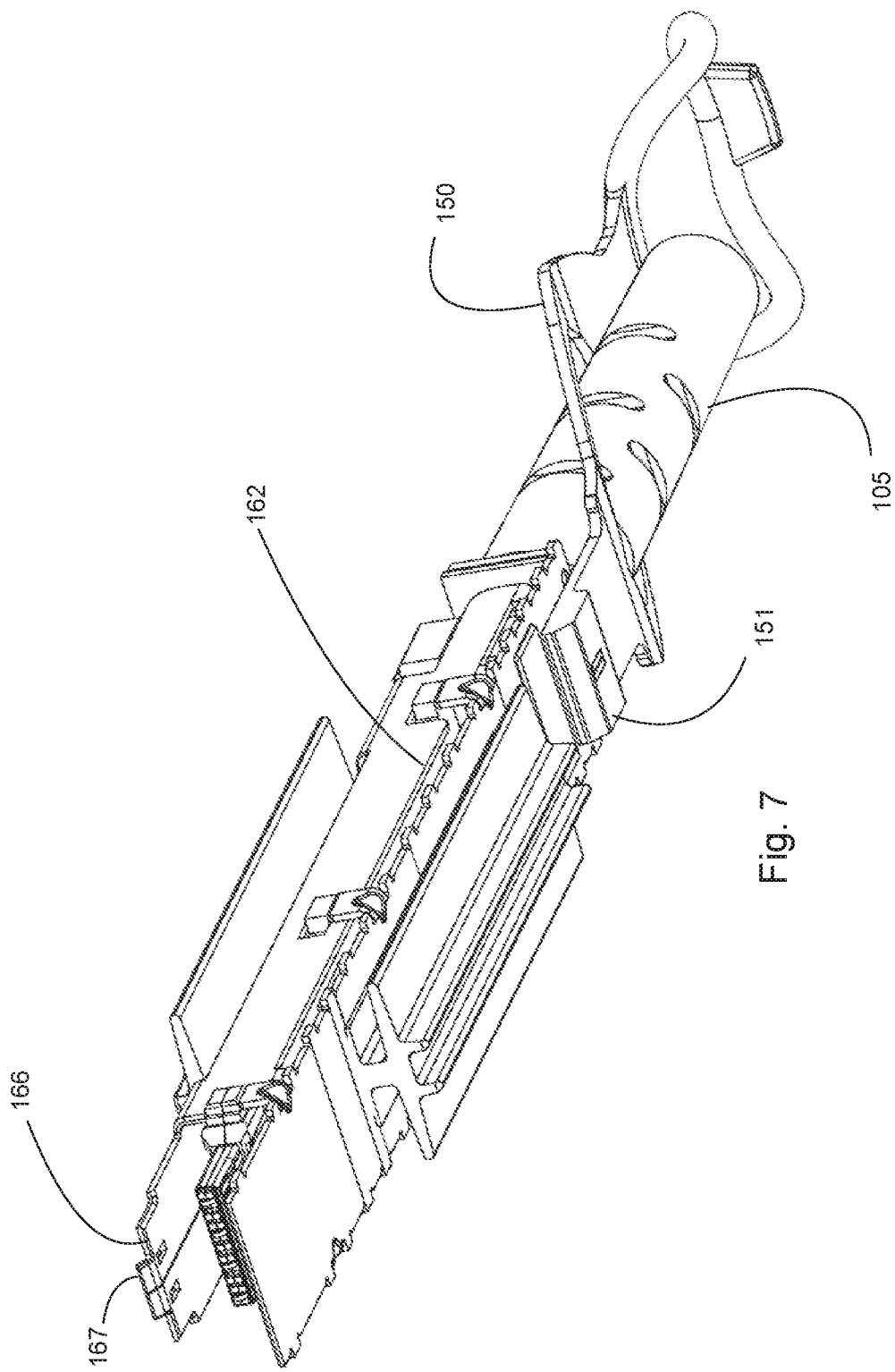
FIG. 7 illustrates another perspective view of the embodiment depicted in FIG. 6.
Figure 8:
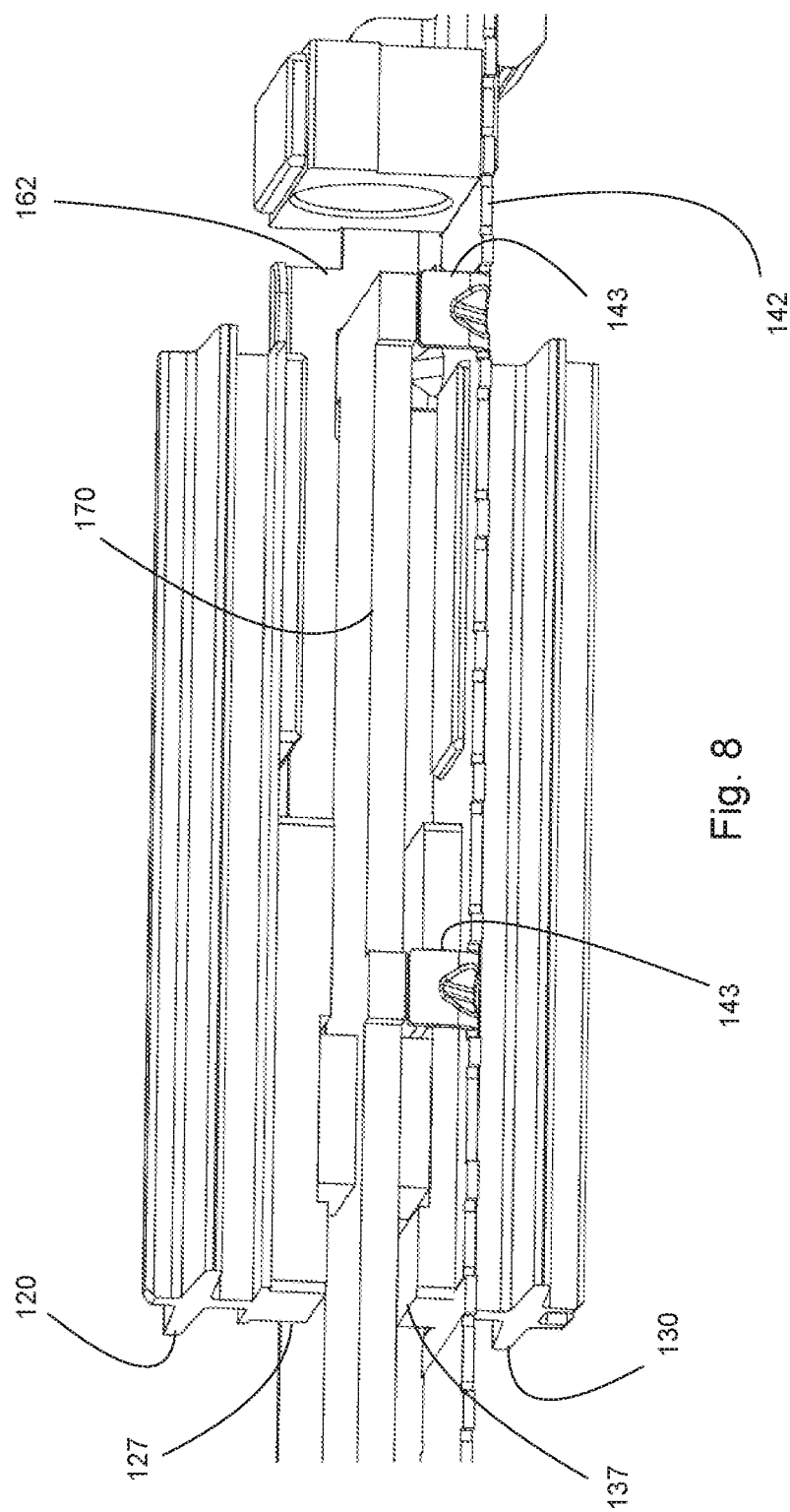
FIG. 8 illustrates an enlarged perspective view of the embodiment depicted in FIG. 6.
Figure 9:
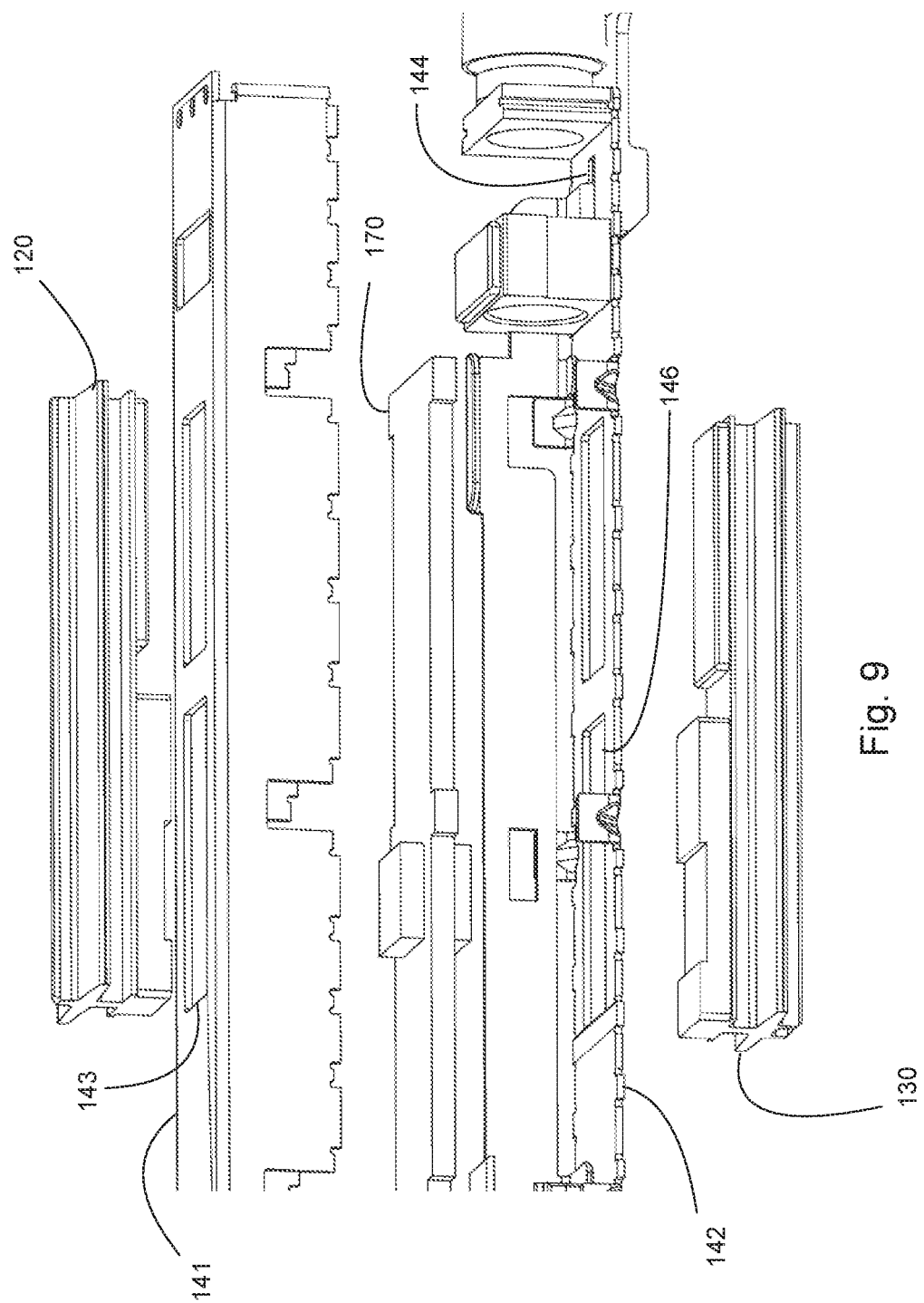
FIG. 9 illustrates a partially exploded perspective view of the embodiment depicted in FIG. 8.
Figure 10:
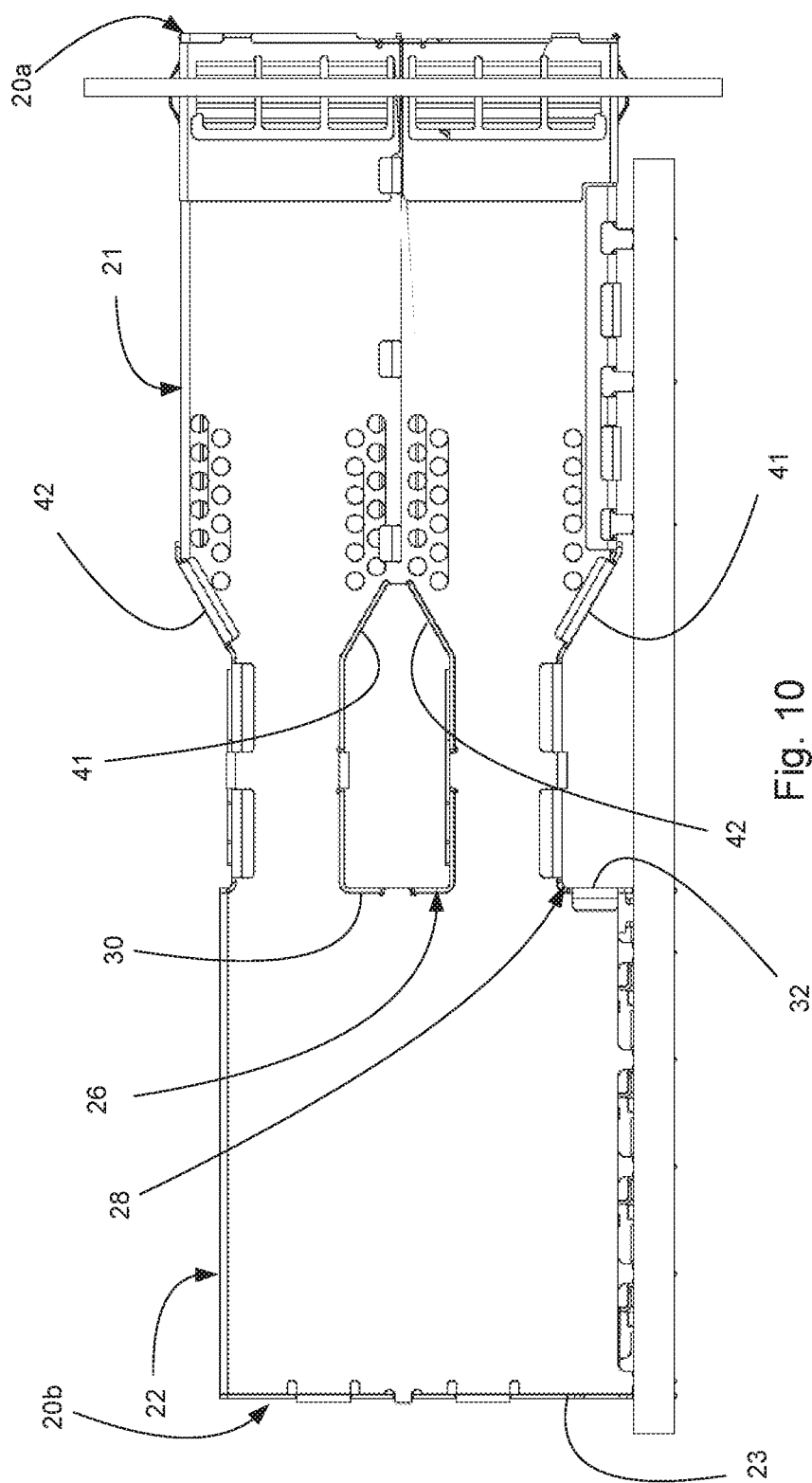
FIG. 10 illustrates an elevated side view of an embodiment of a receptacle.
Figure 11:
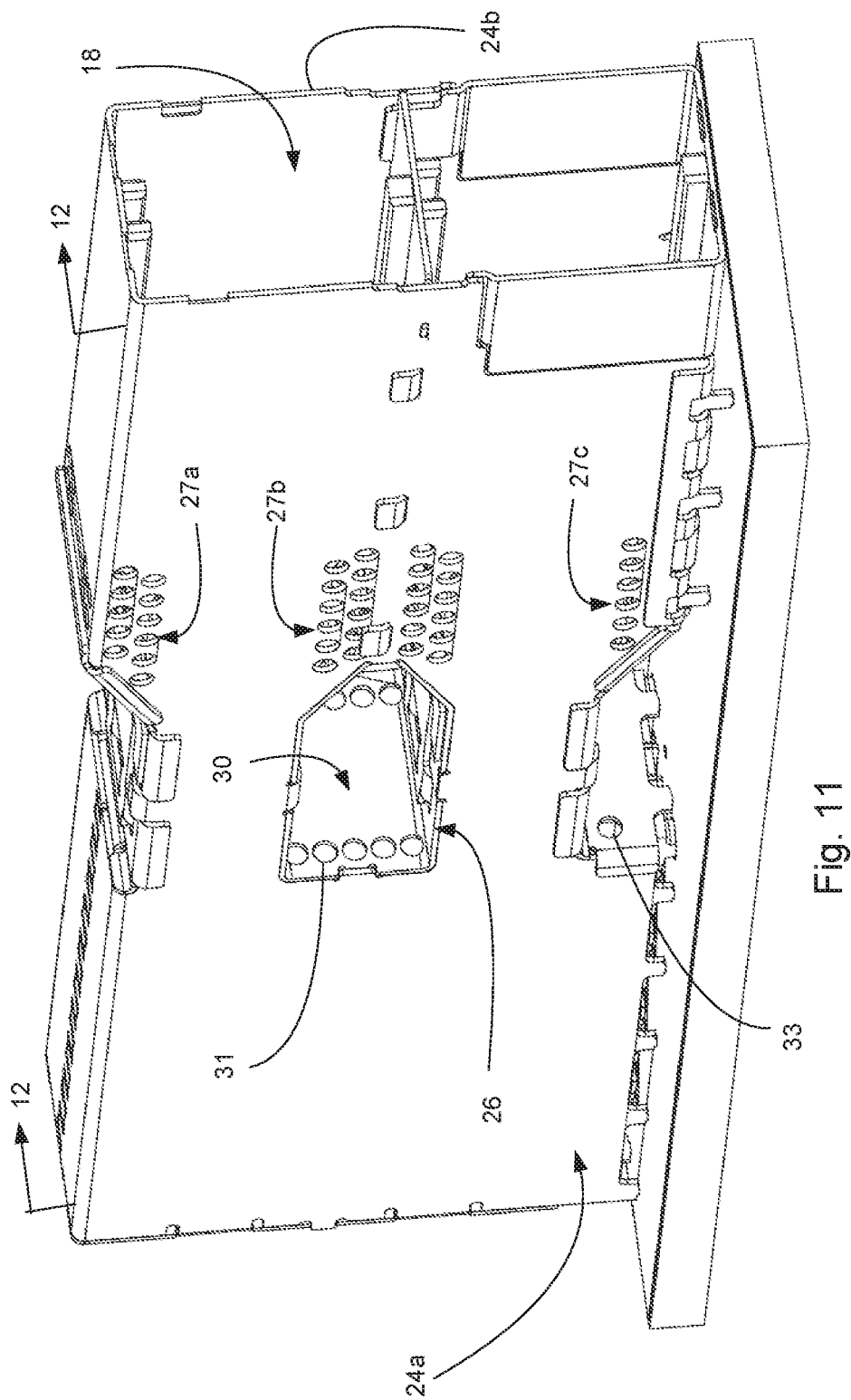
FIG. 11 illustrates a perspective view of the embodiment depicted in FIG. 10.
Figure 12B:
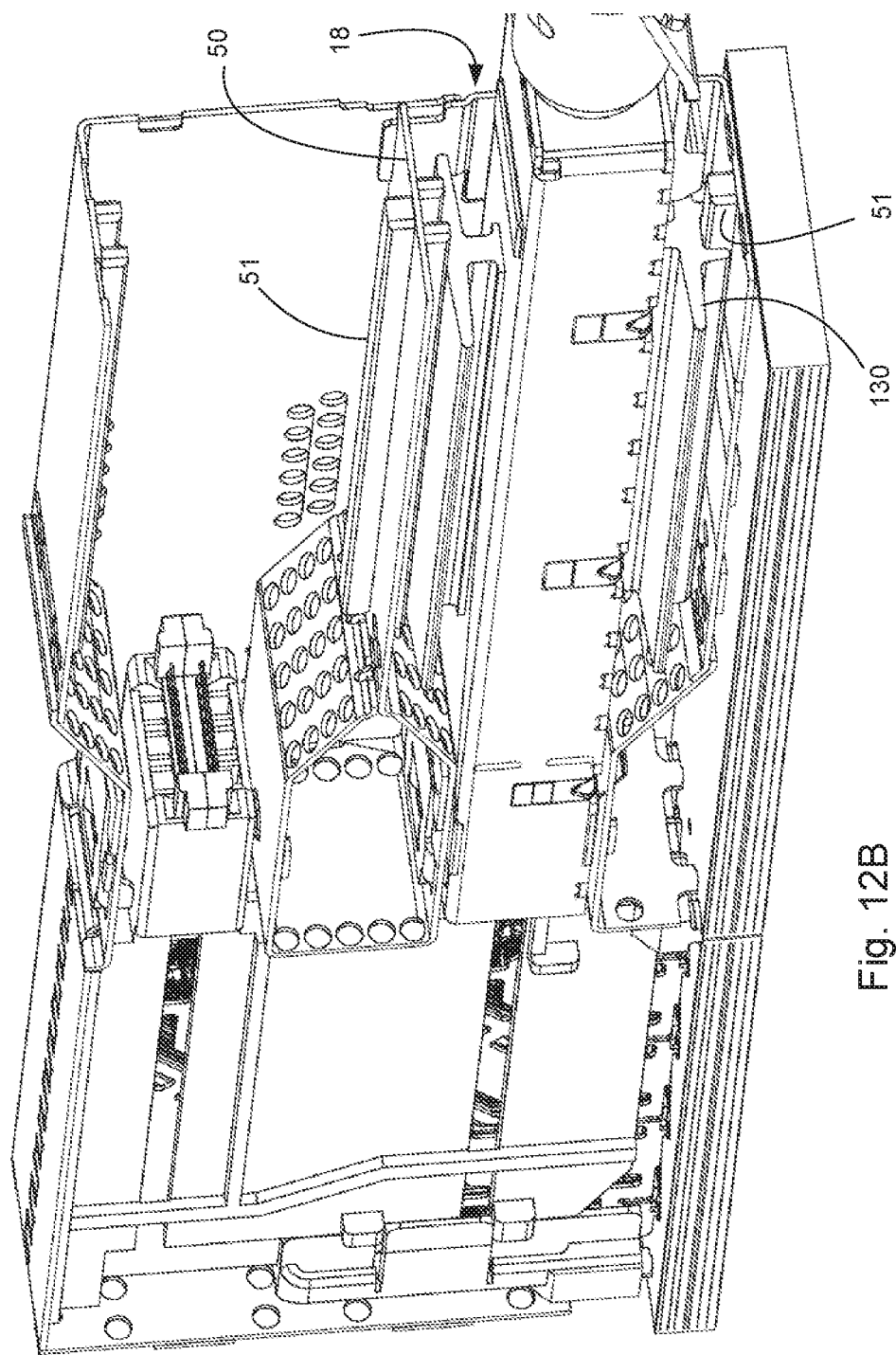
FIG. 12B illustrates a perspective view of a cross-section of FIG. 11, taken along line 12-12 and with a module inserted into a port.
Figure 13A:
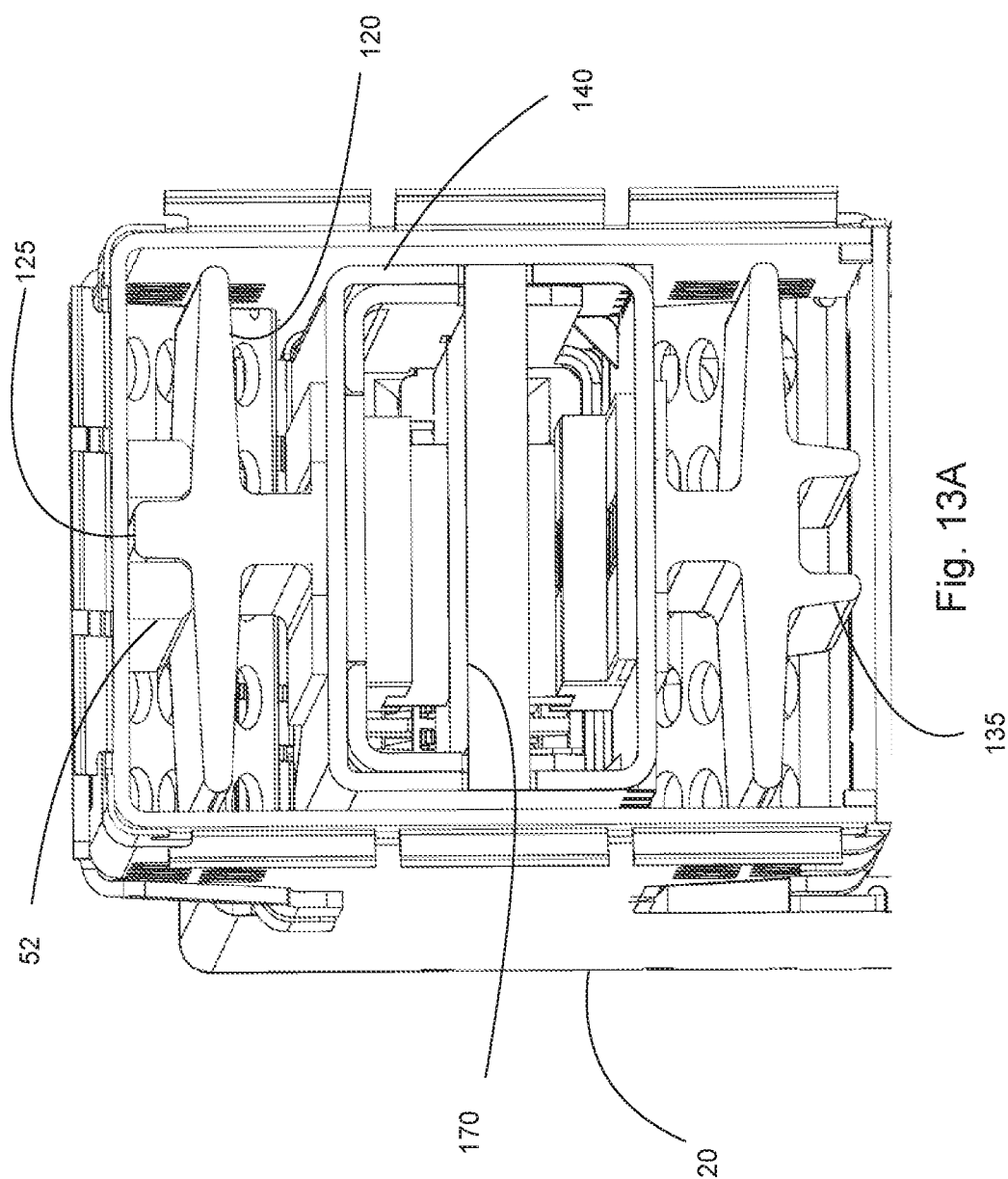
FIG. 13A illustrates a perspective view of a cross-section of an embodiment of a module inserted in a port.
Figure 14:
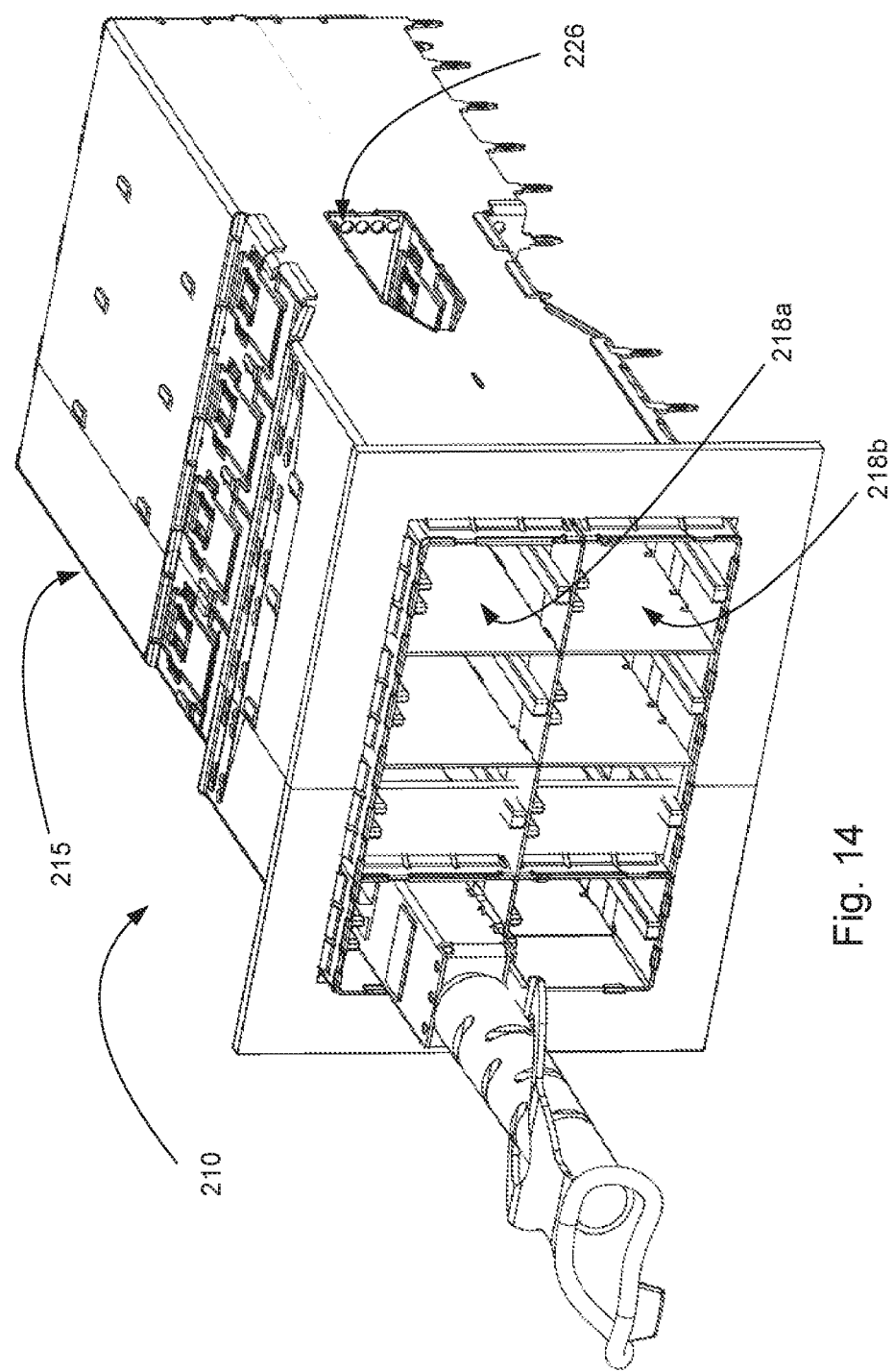
FIG. 14 illustrates a perspective view of a connector system that includes an embodiment of a stacked and ganged receptacle.
Figure 15:
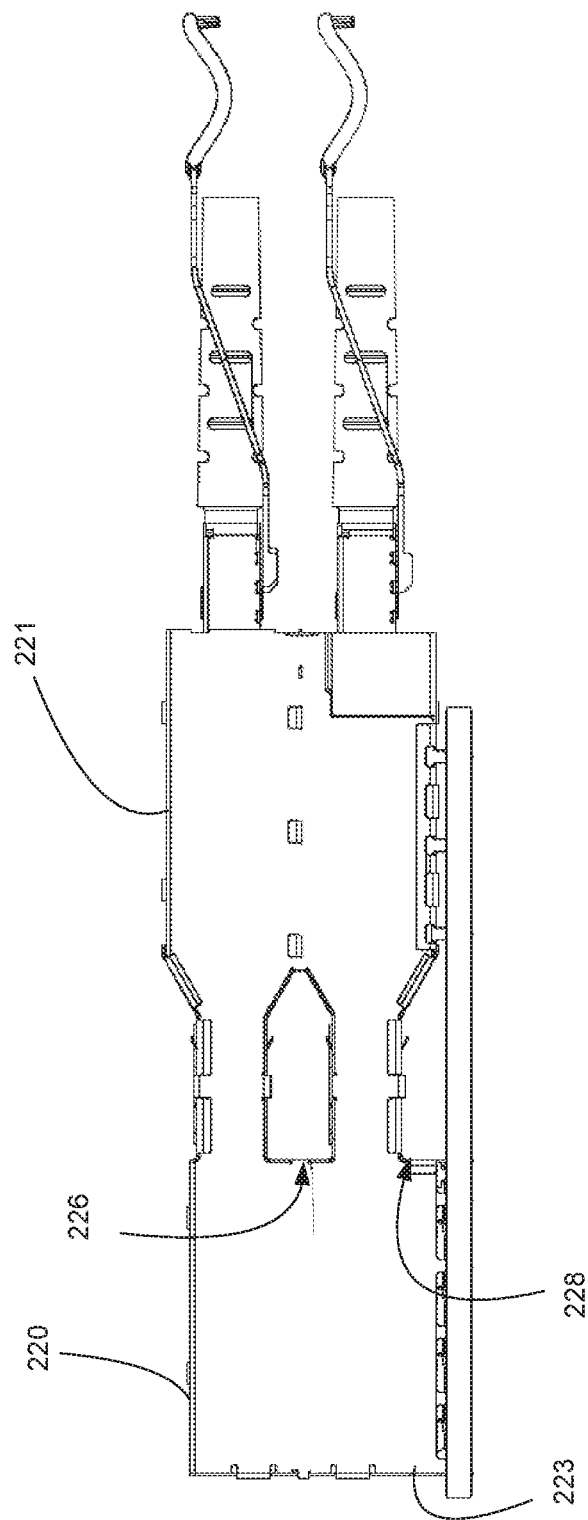
FIG. 15 illustrates an elevated side view of an embodiment of a connector system.
Figure 16:
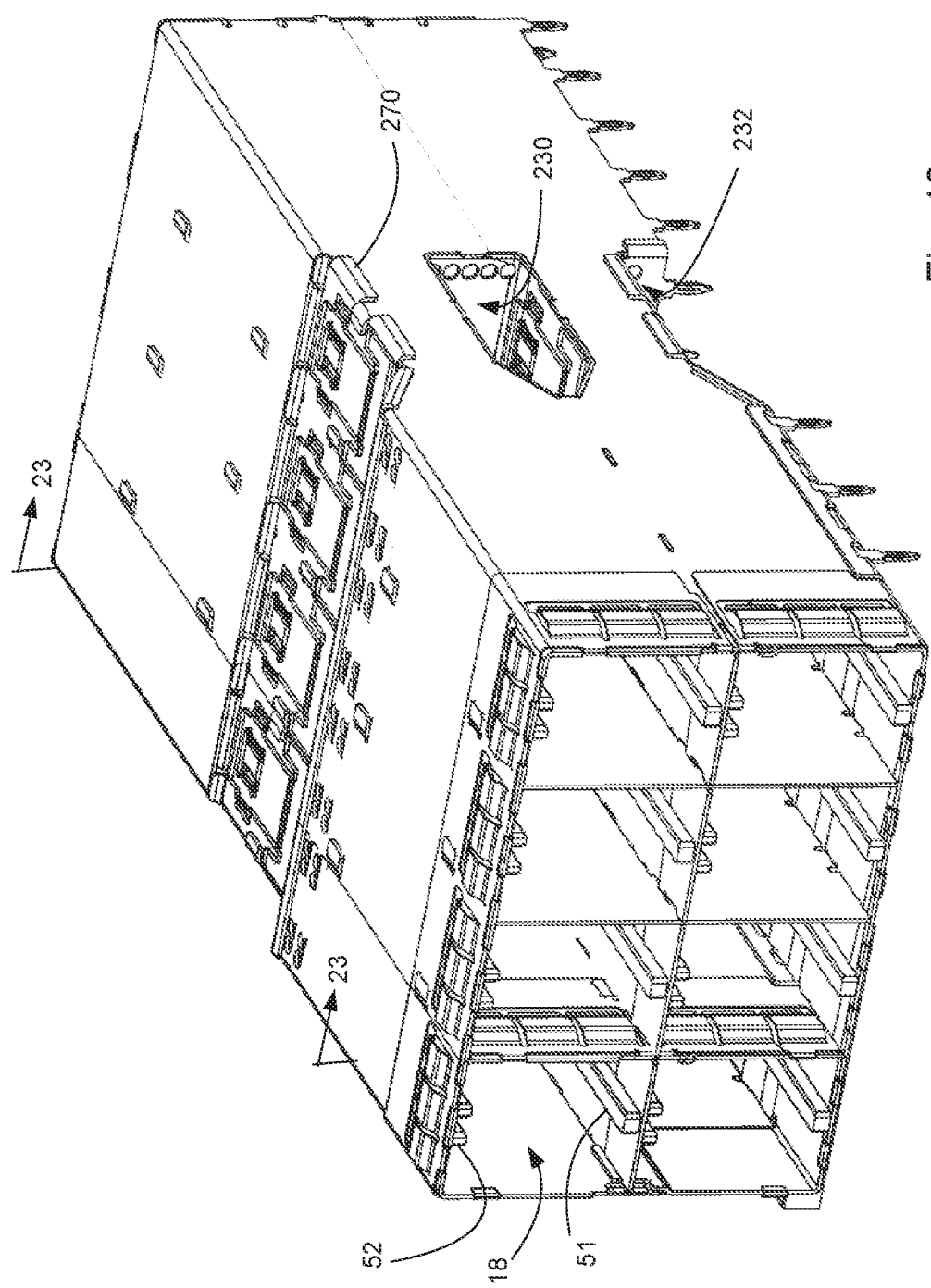
FIG. 16 illustrates a perspective view of an embodiment of a stacked and ganged receptacle.
Figure 17:
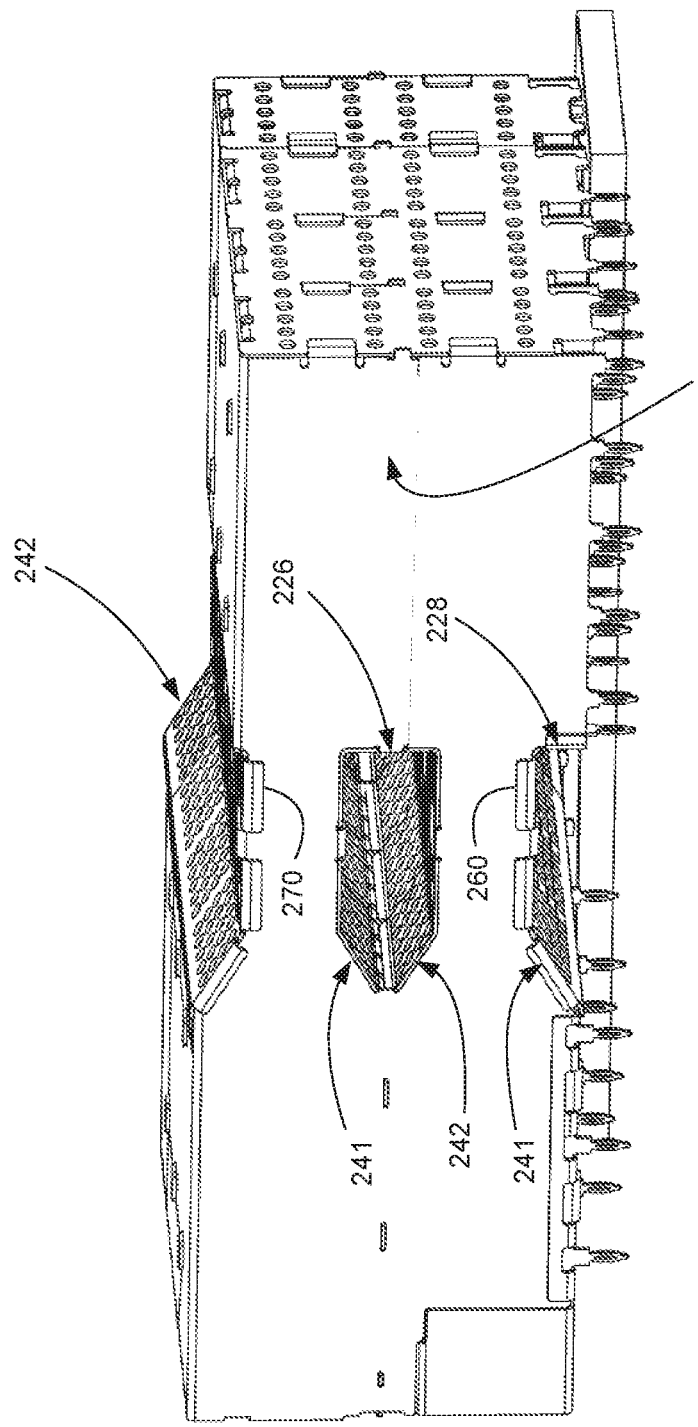
FIG. 17 illustrates another perspective view of the embodiment depicted in FIG. 16.
Figure 18:
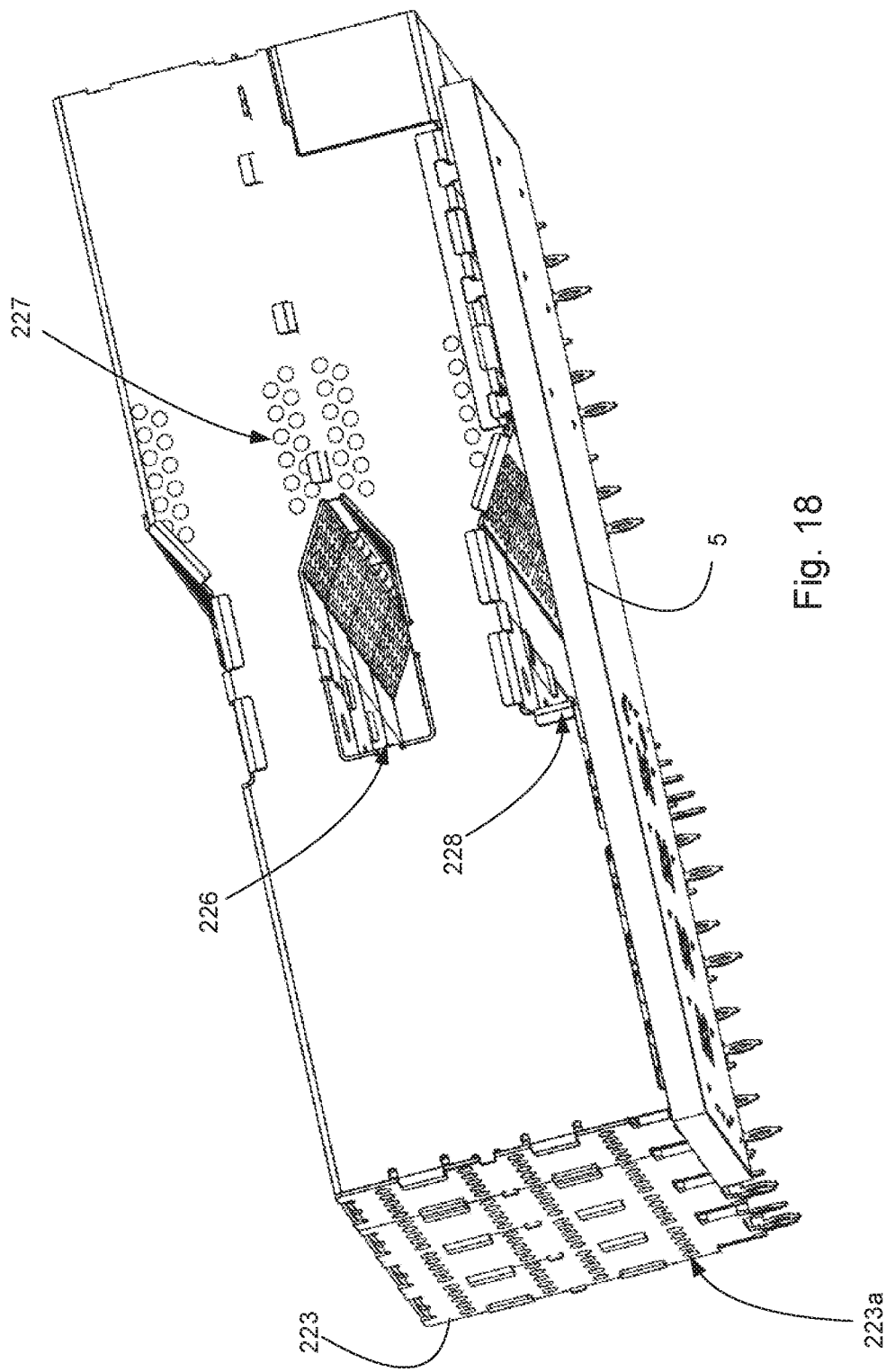
FIG. 18 illustrates another perspective view of the embodiment depicted in FIG. 16.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

As can be appreciated from FIGS. 1-13B, an embodiment of a connector system 10 includes a receptacle 15 that provides two ports 18 that are stacked. The receptacle 15 includes a housing 90 with a card slot 92 aligned with each port 18 (at least one card slot is aligned with each port although a housing with two card slots for each port could also be provided) and a cage 20 that helps protect and shield the housing 90. The housing 90 supports a wafer set 95 and the wafers in the wafer set 95 provide terminals 96 that are positioned in two opposing rows in the card slots 92 (as is conventional in wafer-based construction). As is customary, each port is defined by four walls, for example the top port is defined by walls 24a, 24b and top wall 21 and center wall 50 and the bottom port is defined by walls 24a, 24b, center wall 50 and bottom wall 29. It should be noted that the side walls may extend from a front face 20a of the cage 20 all the way to a back 20b of the housing for superior EMI performance but such a configuration is not required.

A module 100 is inserted into the port so that a paddle card 188 engages the card slot 92. The module 100 includes an internal circuit board 170 that supports active components that generate thermal energy. To provide cooling, a thermal dissipation system 120 is provided on a first side 140a and a thermal dissipation system 130 is provided on a second side 140b of the module 100. The thermal dissipation system 120 includes thermal block 127 that is configured to thermally couple to active components supported by circuit board 170 in the module. Similarly, thermal dissipation system 130 includes a thermal block 137 that is configured to thermally couple to active components. The thermal block 127 extends through opening 143 in top portion 141 and the thermal block 137 extends through opening 146 in bottom portion 142. Additional openings can be provided, depending on the configuration of the thermal dissipation systems and the active components. Thus the module can be configured so that there is one thermal junction between the thermal dissipation systems and the active components. Assuming there is a decent thermal interface between the active components and the thermal block it is straightforward with the disclosure to provide a system that has a thermal resistance of less than 3 C/W between the active components and the thermal transfer area. It is expected that the thermal resistance between the active component and the thermal transfer area can be between 0.5 C/W and 3 C/W of thermal resistance, depending on the materials used. Flowing air can then remove the thermal energy directly from the thermal dissipation system, which should substantially improve the ability of the connector system to dissipate thermal energy. The thermal dissipation system 120 includes a rail 120 and the thermal dissipation system 130 includes a rail 135. Two rails 51, 52 are positioned on opposite walls of the port and the rails are configured to mate with the rails 125, 135 provided on module 100. The rails 51, 52, 125, 135 allow a body 140 of the module 100 to be spaced apart from the walls of the port while controlling the orientation and alignment of the module 100 as it is inserted into the port 18. The ability to provide space between the body 140 and the walls of the port 18 allows air to flow into the port, over the thermal dissipation systems 120, 130 and then out the vent walls 41, 42 provided in the receptacle 15.

As depicted, each port 18 includes two vent walls 41, 42. The vent walls 41, 42 include a plurality of apertures that are sized so that air can pass through the vent walls while still providing suitable EMI protection. The vent walls 41 are in communication with side openings 26, 28. Thus air can flow into the port, along the thermal dissipation system(s), through the respective vent walls and then out the side openings 26, 28. The side opening 26 includes a back wall 30 that can include apertures 31. Similarly the side opening 28 includes a back wall 32 that can include apertures 33. The optional apertures 31, 33 can allow air to flow past the housing 90 (possibly through channel 94 which allows air to flow past vertical rib 93) and out rear apertures 23a in rear wall 23.

Due to the additional height of the thermal dissipation systems, the top wall 21 is depicted as higher than the top wall 22. As can be appreciated, depending on the size of the thermal dissipation systems the top wall 21 can be the same height as the top wall 22 but superior thermal performance is possible if the connector system is configured so that the top wall 21 is higher than wall 22.

As can be appreciated, because the embodiment depicted in FIG. 1 is a stacked but not ganged configuration, additional thermal apertures 27a, 27b, 27c can be provided on the side of the port to provide additional venting possibilities.

The rails on the module are depicted as being integrated into a thermal dissipation system on both sides of the module connector. In other embodiments, the rails on the module can be separate from the thermal dissipation system. The depicted thermal dissipation system is shown with fins 122, 132 as the thermal transfer area, it being understood that any desirable configuration (such as columns, channels, etc.) could be used, and allows for air passing over the thermal transfer area to absorb heat and then the air is directed out the cage through the vent walls. As the thermal dissipation system is thermally coupled to the internal heat-generating components, the thermal resistance between the fins 122, 132 (which dissipate the thermal energy to passing air) and the heat-generating components can be kept cool. Thus the depicted embodiments illustrate systems that can help cool the module in a more efficient manner.

As can be appreciated from Figures, the rail system can be configured so that the two rails in the port have an A and a B configuration and the mating rails in the module connector have a B and an A configuration (with the A configuration mating with the B configuration). Naturally, other configurations are possible. For example, without limitation, the rails in the port could have a first and a second configuration and the rails in the module connector can have a third and a fourth configuration, the third configuration matable with the first configuration and the fourth configuration matable with the second configuration. Regardless of the configuration, the rails can be used to ensure the module is can be reliably mated to the housing.

In addition, in an alternative embodiment the rail on one side of the port could be omitted. As can be appreciated from FIGS. 13A-13B, for example, the rail on one side of the port could be removed. In such a system the module could still have both rails but one would not mate with a corresponding rail in the port. As can be appreciated, such a system still uses one rail in the port to ensure the module is inserted in the correct orientation but the alignment and orientation is provided by the interface between the walls of the port that do not have rails in combination with the provided rail. Naturally both rails could be omitted but such a system would need some other feature to provide orientation control.

It should be noted that while it is often preferable that the rail on the wall of the port extend a substantial distance (e.g., more than one third of the length of the port) so as to provide good orientation control, in an alternative embodiment the rail be replaced with a tab and/or may be intermittently provided. The rail helps provide for orientation and alignment and thus can be replaced by other alignment features, such as the shape of the cage or the tolerance between the wall of the port and a housing of the module connector.

Turning to FIGS. 14-39, an embodiment of a connector system 210 that includes a receptacle 215 that includes a cage 220. A housing 290 is positioned in the cage and the housing 290 supports wafer sets 295 that provide terminals 296 in the card slots 292 that are provided for each port. The receptacle 215 includes top ports 218a and bottom ports 218b that are ganged (e.g., ports are separated by internal walls 224c and extend four across) so as to provide four ports 218 across the receptacle 215. As in the previous embodiment, side openings 226, 228 are provided to allow air to flow into the port, out through vent walls 241, 242 and then out of side openings 226, 228. As noted above, the vent walls have apertures sized to allow air to flow through while still providing acceptable EMI performance. Each port therefore has a total aperture surface area that can act to limit airflow through the ports. To allow for effective cooling, it has been determined that the side opening can be sized such that the surface area of the relevant vent walls is equal to an area of the side openings. As can be appreciated, in a ganged solution with four ports side by side the surface area of the relevant vents walls would be vents walls associated with two ports (as it is expected that air flow going through the other ports would exit the side wall opening on the other side of the receptacle.

The vent walls can be formed in a vent cover 260 or in a latching member 270, 270' (latching members 270 and 270' are similar in construction and thus just latching member 270 will be discussed in detail). The latching member 270 provides a transition between top wall 221 and top wall 222, which is positioned lower than top wall 221.

The latching member 270 includes a main member 271 that includes an angled member 272. Apertures in the angled member 272 provide a corresponding vent wall. A latching member 273 includes a secured end 274 and a translating end 275. The secured end 274 is secured to the main member 271 via known techniques such as solder or welding or adhesive. The translating ending 275 includes locking tabs 276 and translating tabs 277 that extend through openings in the main member 271. The locking tab 276 includes an angled side 276a and a front side 276b that is straight.

Because air flows along a surface of the module to directly cool the module, a conventional latch system such as is used in miniSAS or QSFP style connectors is not as suitable. The depicted configuration provides for latch system that allows for air to flow along one or more surfaces of the module while still providing a reliable system to disconnect the module from the receptacle. As depicted, a pull tab 150 (which can have any desirable shape) is provided and the pull tab 150 is mechanically coupled to a sliding chassis 160. Preferably the pull tab 150 can transitioned from a top side 140a of the module 100 to a bottom side 140b of the module but such a construction, while beneficial as it can help improve ergonomics and access to the pull tab 150 when there are a number of ports, is not required. The sliding chassis 160 internally extends lengthwise along a substantial portion of the module from a first end 163 of the sliding chassis, which is mechanically coupled to the pull tab, toward a second end 166. The sliding chassis can transition from the bottom side 140b of the module at the first end 163 to the top side 140a of the module 100 at the second end 166. The second end has one or more fingers 167 that are configured to press against translating tabs 277 when the fingers 167 are translated in a first direction. Thus, when the pull tab 150 is translated in a first direction, the pull tab 150 pulls the sliding chassis 160 and causes the sliding chassis 160 to translate. The sliding chassis 160 causes the fingers to translate in the first direction so that the fingers 160 press against the translation tabs 277 of the latching member 270, causing the translation tabs 277 to translate in a second direction (the first and second direction can be substantially perpendicular). The translation of the translation tabs 277, which are mechanically coupled to the locking tabs 276, causes the locking tabs 276 to translate in the second direction, thus causing the locking tabs 276 to cease to engage retention slots 148 in the module 100 so that the module 100 can be removed from the port. Thus, translating the pull tab 150 allows the module 100 to be removed from the port.

When mating with the receptacle the body 140 of the module 100 is inserted into the port 218 and the body 140 presses on the angled side 276a and causes the translating end 275 to translate upward. Once the module is fully inserted, the locking tab 276 slips into the retention slot 148 in the body 140 and paddle card 188 is inserted into card slot 292. As the front side 276b is straight, pulling on the module does not cause the locking tab 276 to translate and thus the module 100 remains securely latched.

As noted above, to remove the module 100 the pull tab 150 can be translated and translation of the pull tab 150 will cause the sliding chassis 160 to translate. It should be noted that the depicted embodiment functions with a translation in a rearward direction but the latching system could be modified (by reversing translating fingers 167, for example) so that a push would unlatch the system. The pull tab 150 is provided on top side of the module for easy access and extends to a pull block 151 that is on a bottom side of the module. The pull block 151 is connected to rear end 163 of arm 162. More specifically, cross arm 164 extends along an internal side of the second side 140b and the cross arm 164 includes a leg 169 that extends through channel 144 in the body 140. The leg 169 engages a block aperture 156 in the pull block 151, thus translating the pull tab 150 causes the sliding chassis 160 to translate. The arm 162 is positioned inside the body 140 and extends along a side of the module 100 and the arm 162 includes notches 162a that allow the sliding chassis 160 to translate around features such as retention tabs 143. The arm 162 extends to a front shelf 166 that extends along the internal side of the first side 140a. The front shelf 166 includes fingers 167 that are configured to engage translation tabs 277 when the sliding chassis 160 is translated.

Thus, the locking tabs 276 securely engage the body 140 once the module 100 is installed. If the pull tab 150 is translated, the fingers 167, which are aligned in latch opening 149, press against and urge upward the translating tabs 277. Translation of the translating tabs 177 in an upward direction also translates the locking tabs 176 in an upward direction, which then allows the module 100 to be removed from the port.

Figure 34:
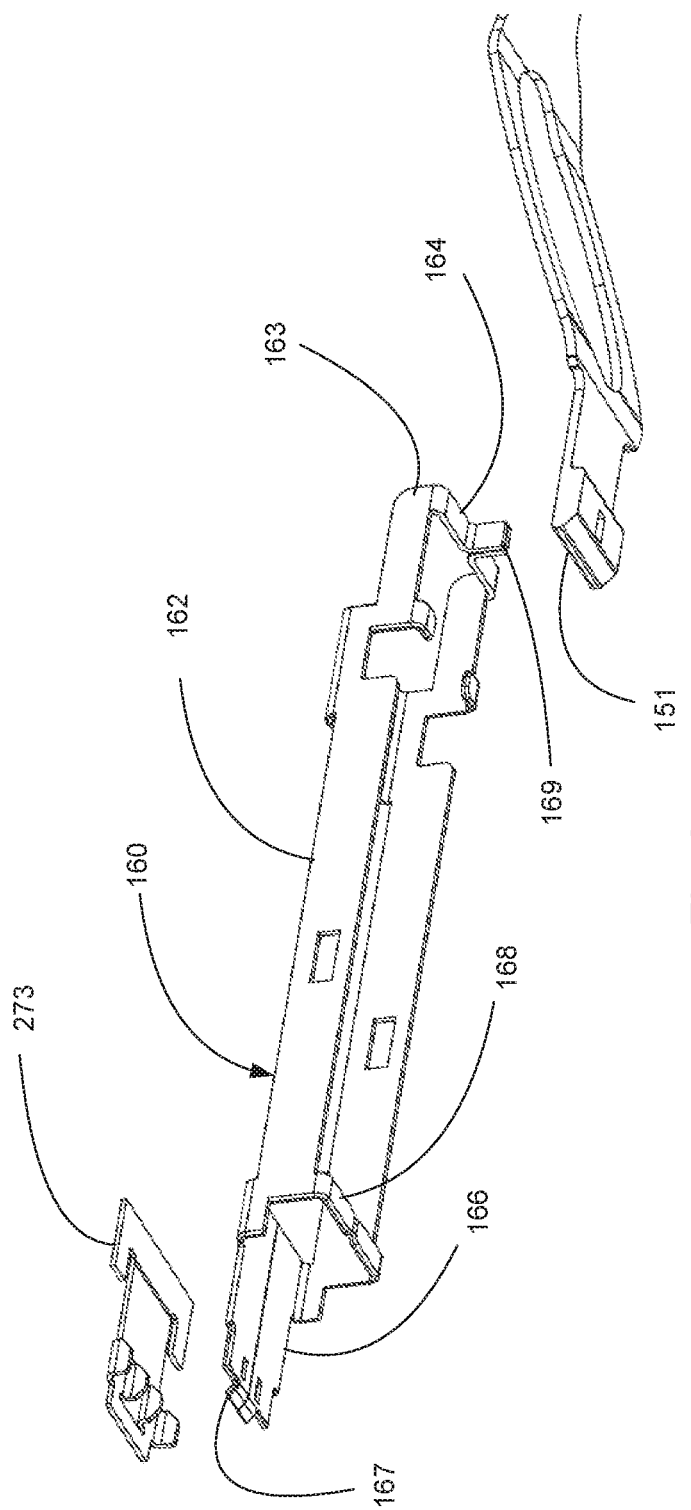
FIG. 34 illustrates a simplified exploded perspective view of a sliding chassis and interfacing elements.
Figure 35:
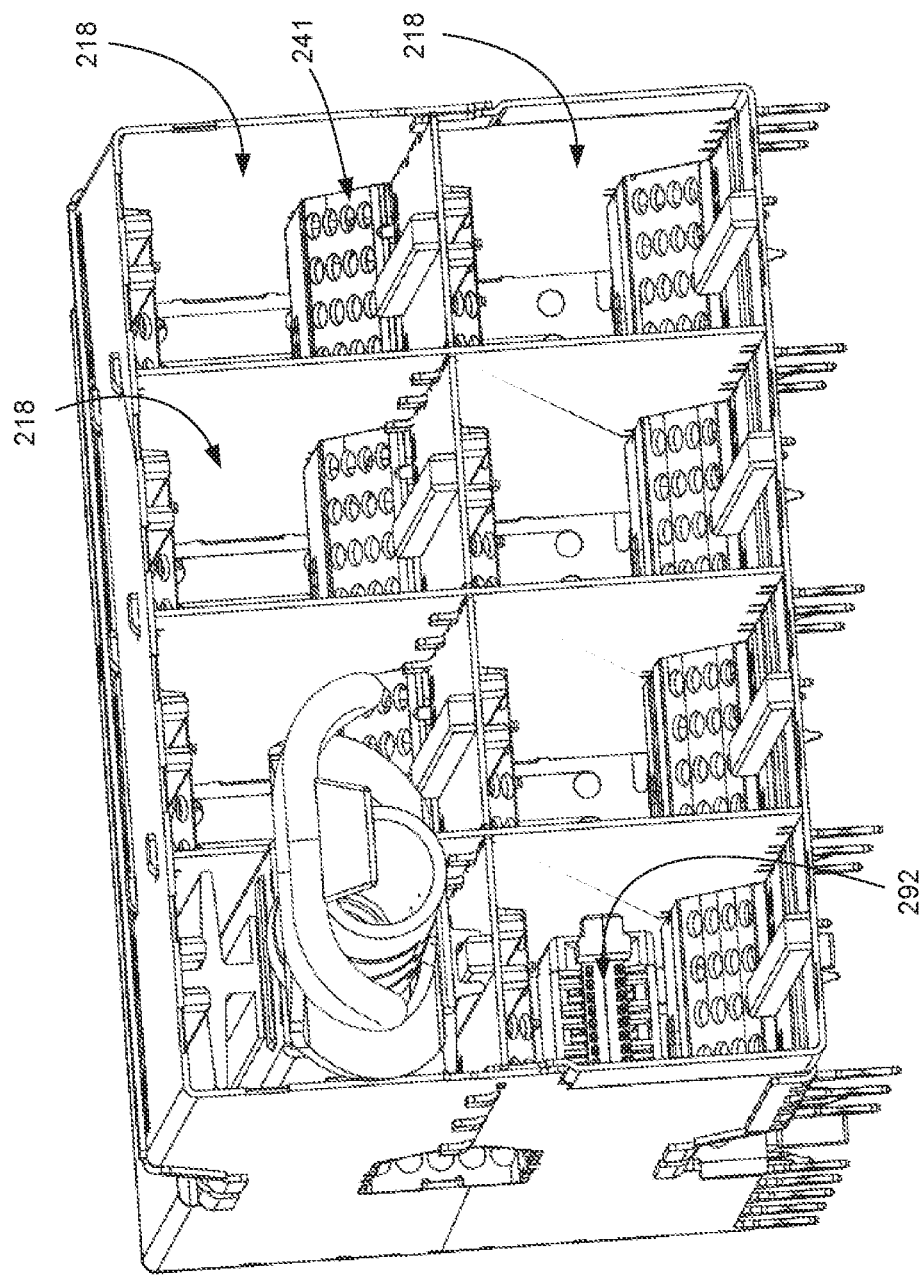
FIG. 35 illustrates another perspective view of an embodiment depicted in FIG. 14.
Figure 36:
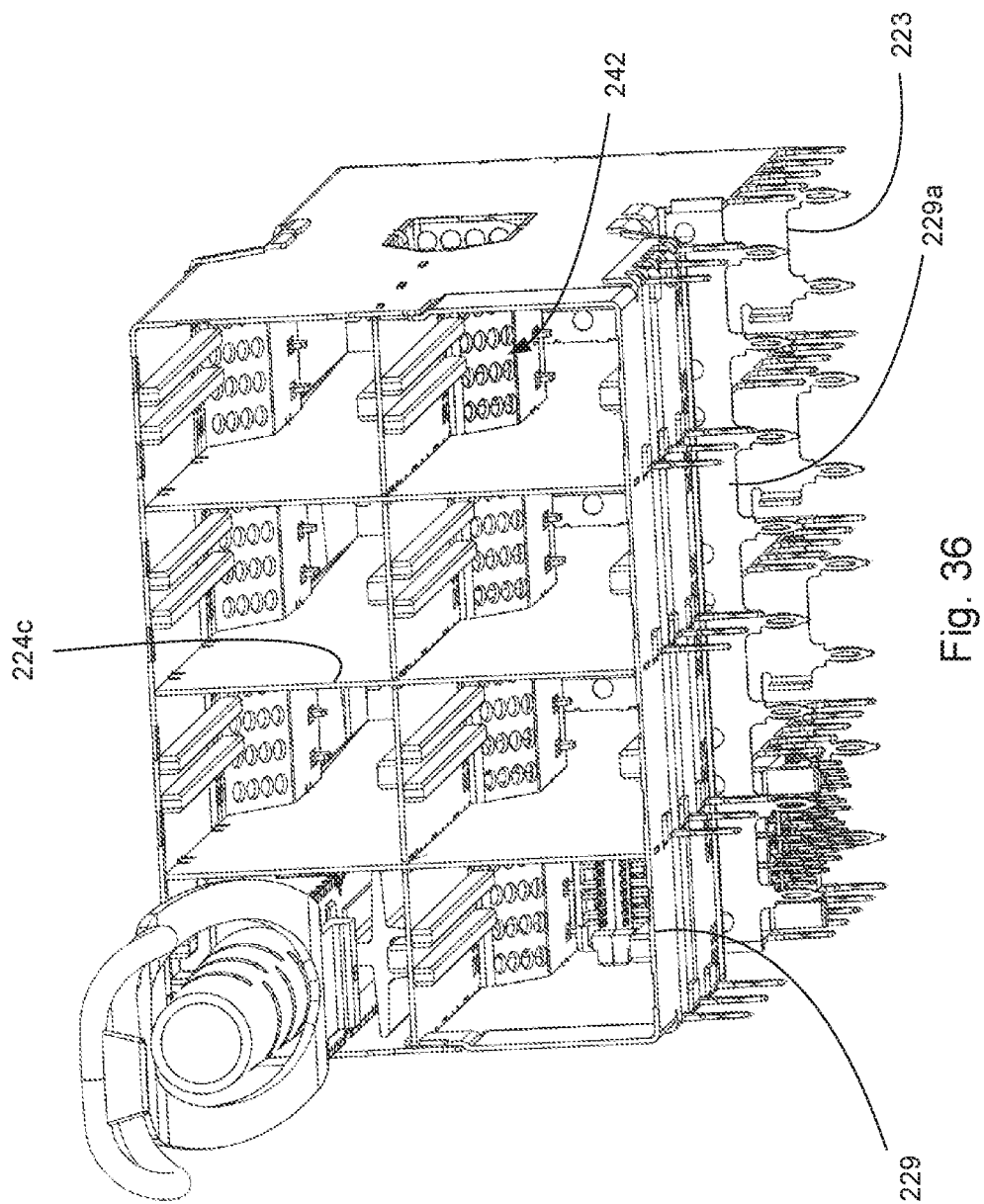
FIG. 36 illustrates another perspective view of the embodiment depicted in FIG. 35.
Figure 37:
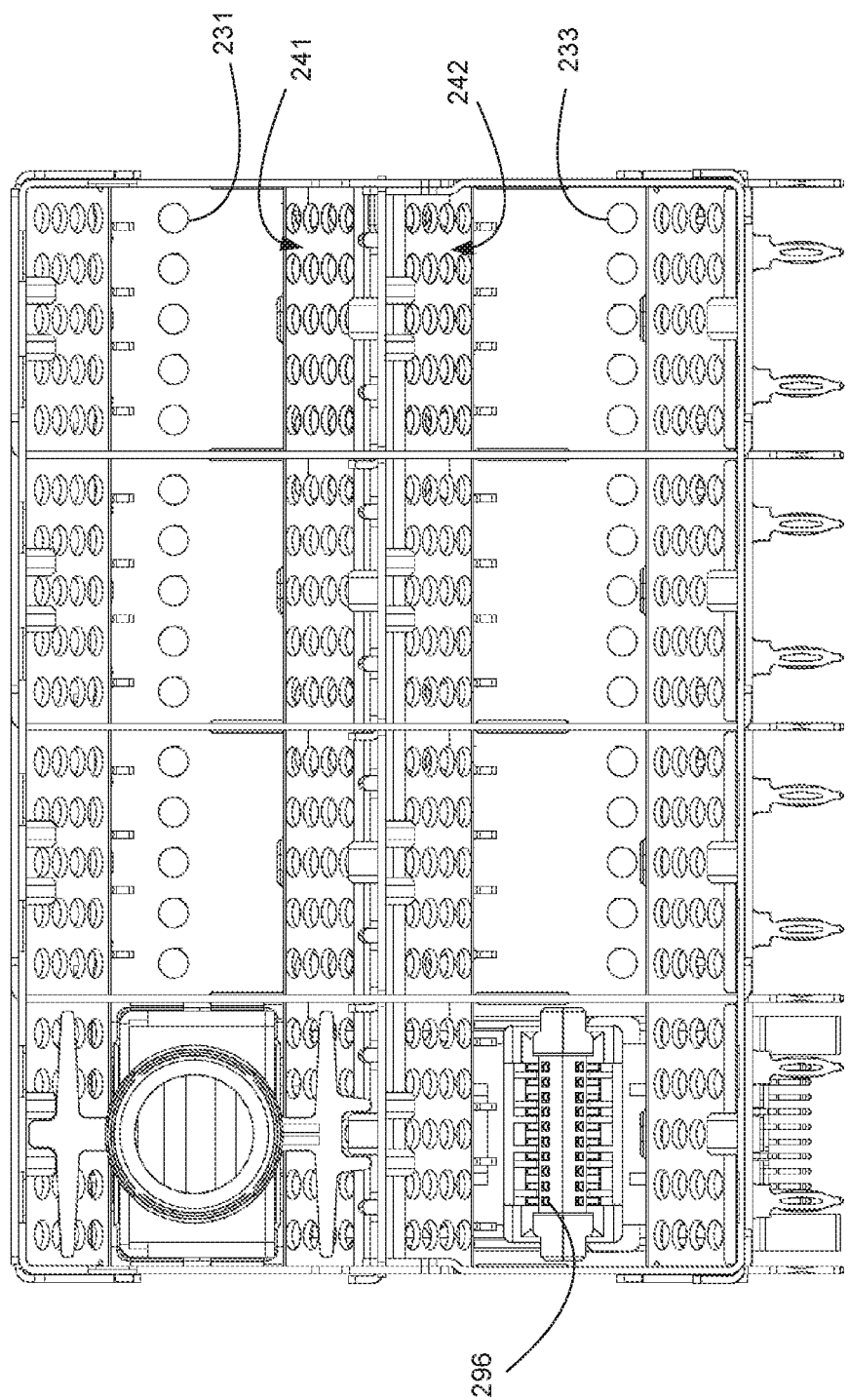
FIG. 37 illustrates an elevated front view of the embodiment depicted in FIG. 35.
Figure 38:
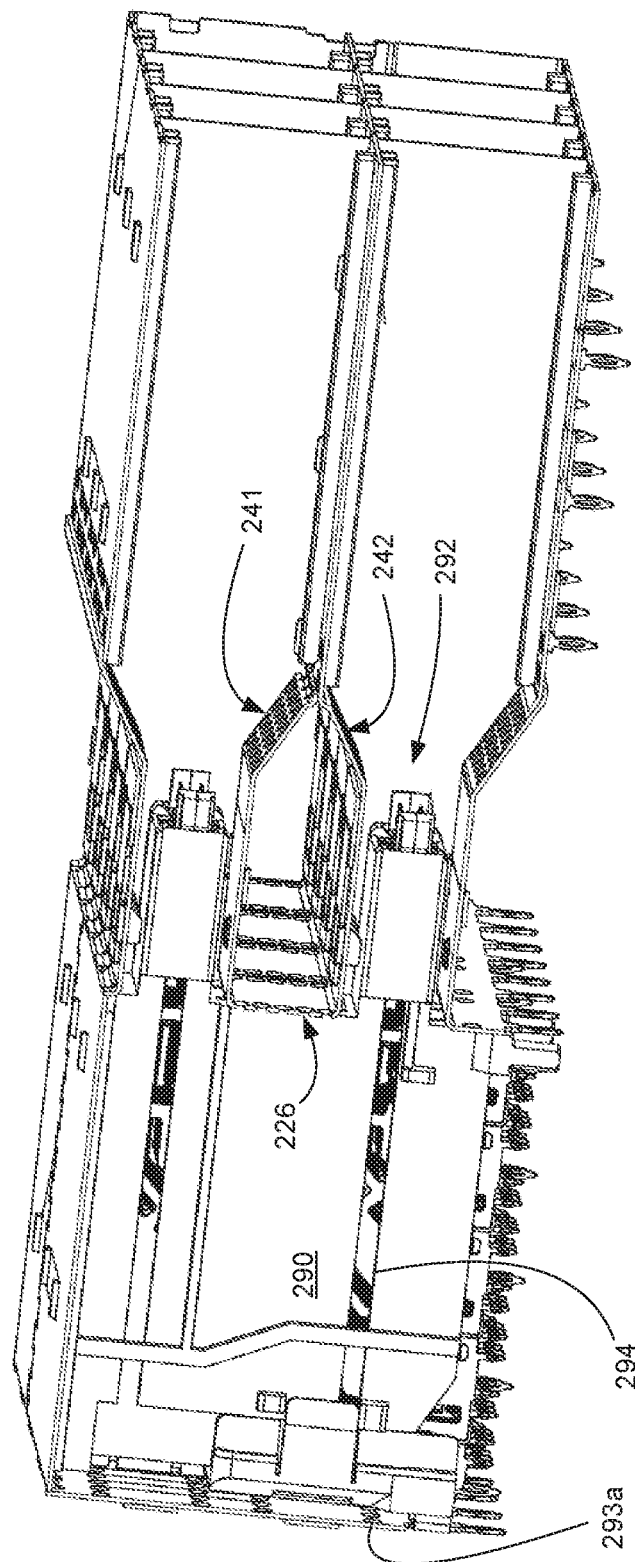
FIG. 38 illustrates a perspective view of the cross-section taken along line 23-23 in FIG. 16.
Figure 39:
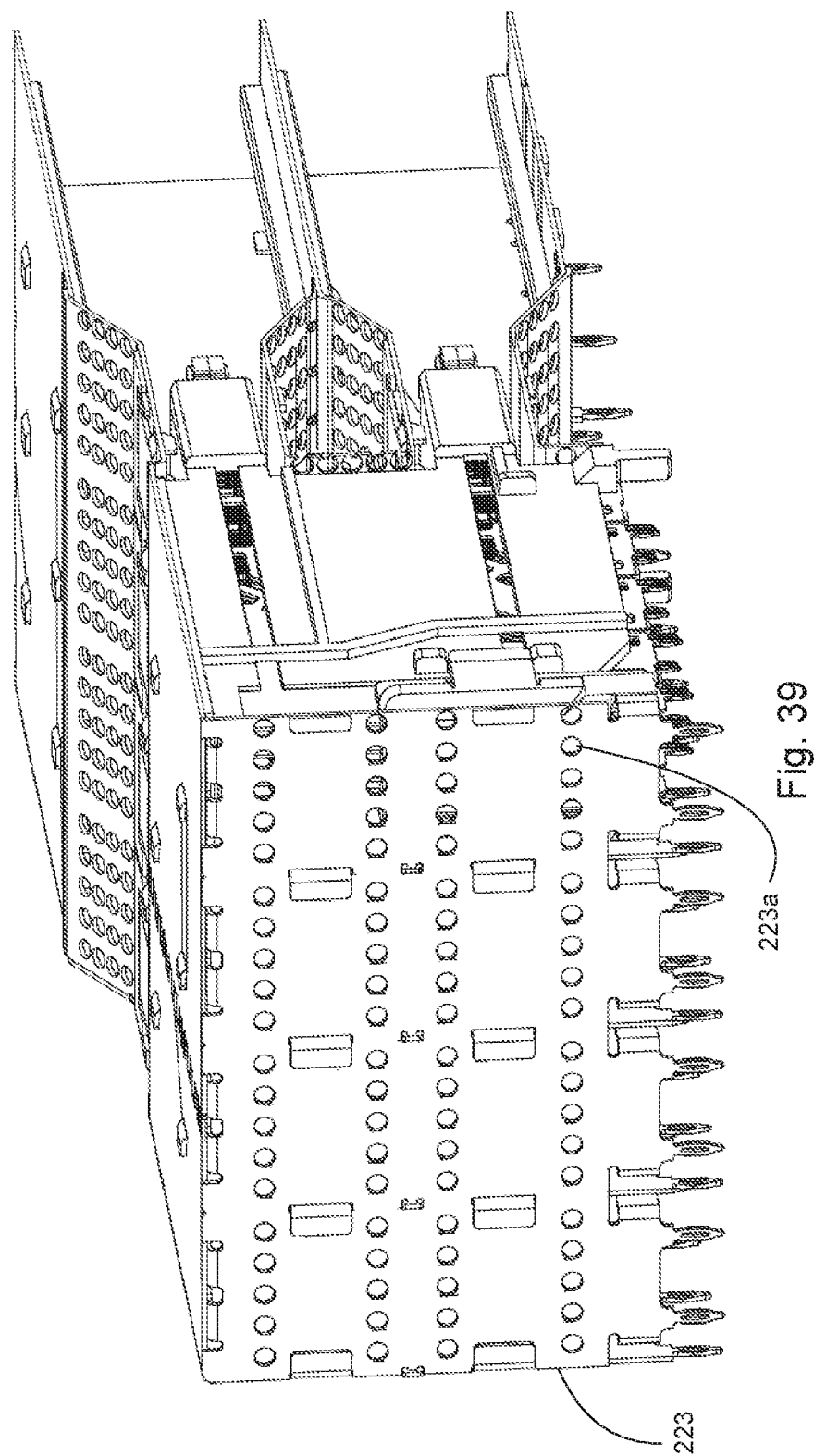
FIG. 39 illustrates another perspective view of the embodiment depicted in FIG. 38.
Figure 40:
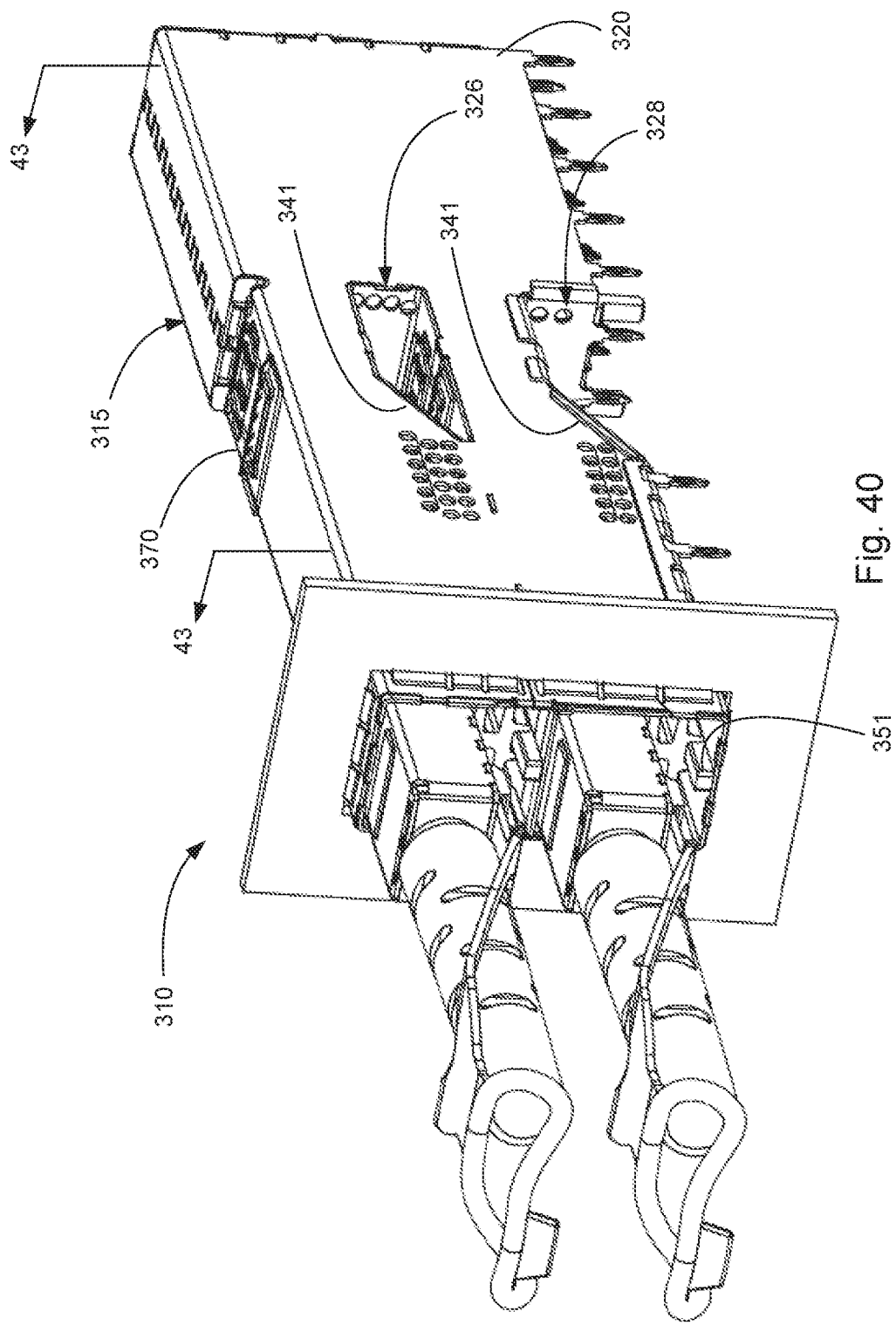
FIG. 40 illustrates a perspective view of another embodiment of a connector system.
Figure 41:
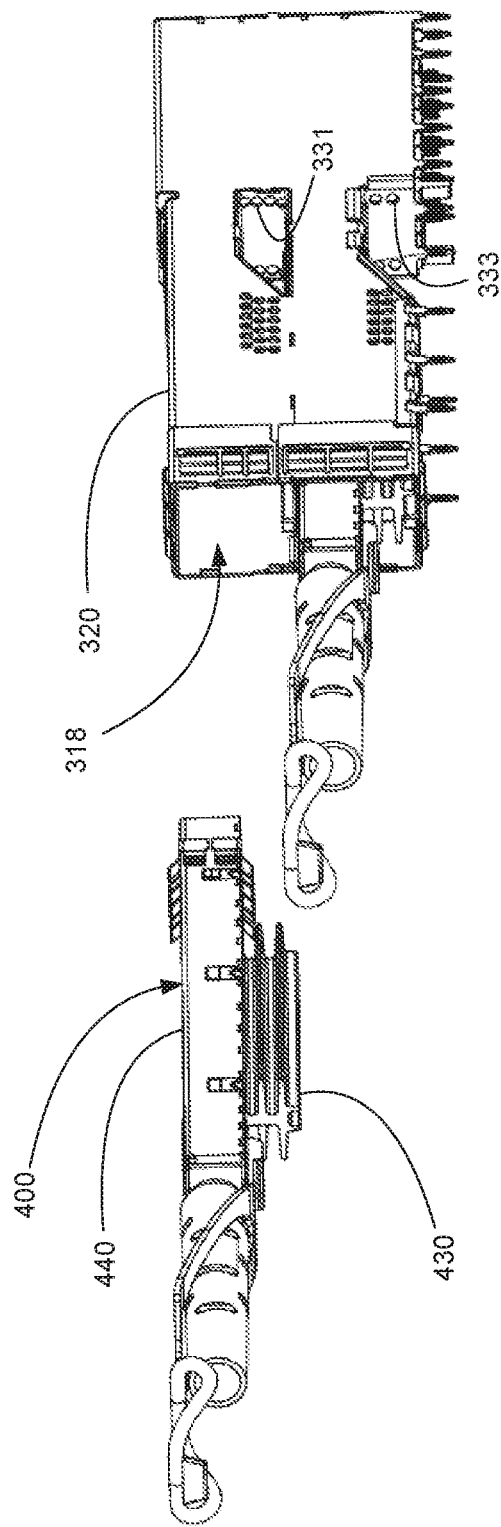
FIG. 41 illustrates a partially exploded perspective view of the embodiment depicted in FIG. 40.
Figure 42:
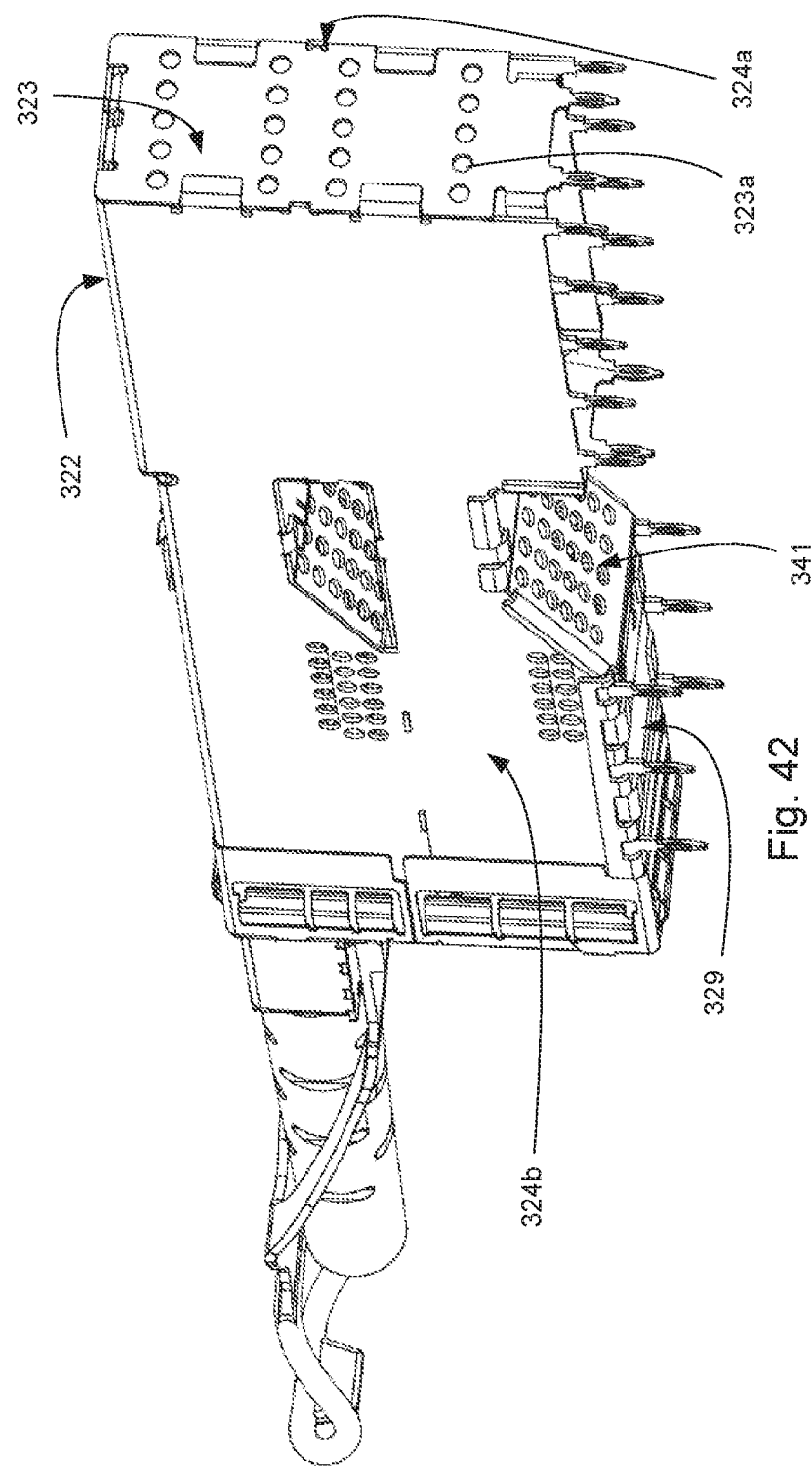
FIG. 42 illustrates another perspective view of the embodiment depicted in FIG. 41 but with one module in a mated position.
Figure 43:
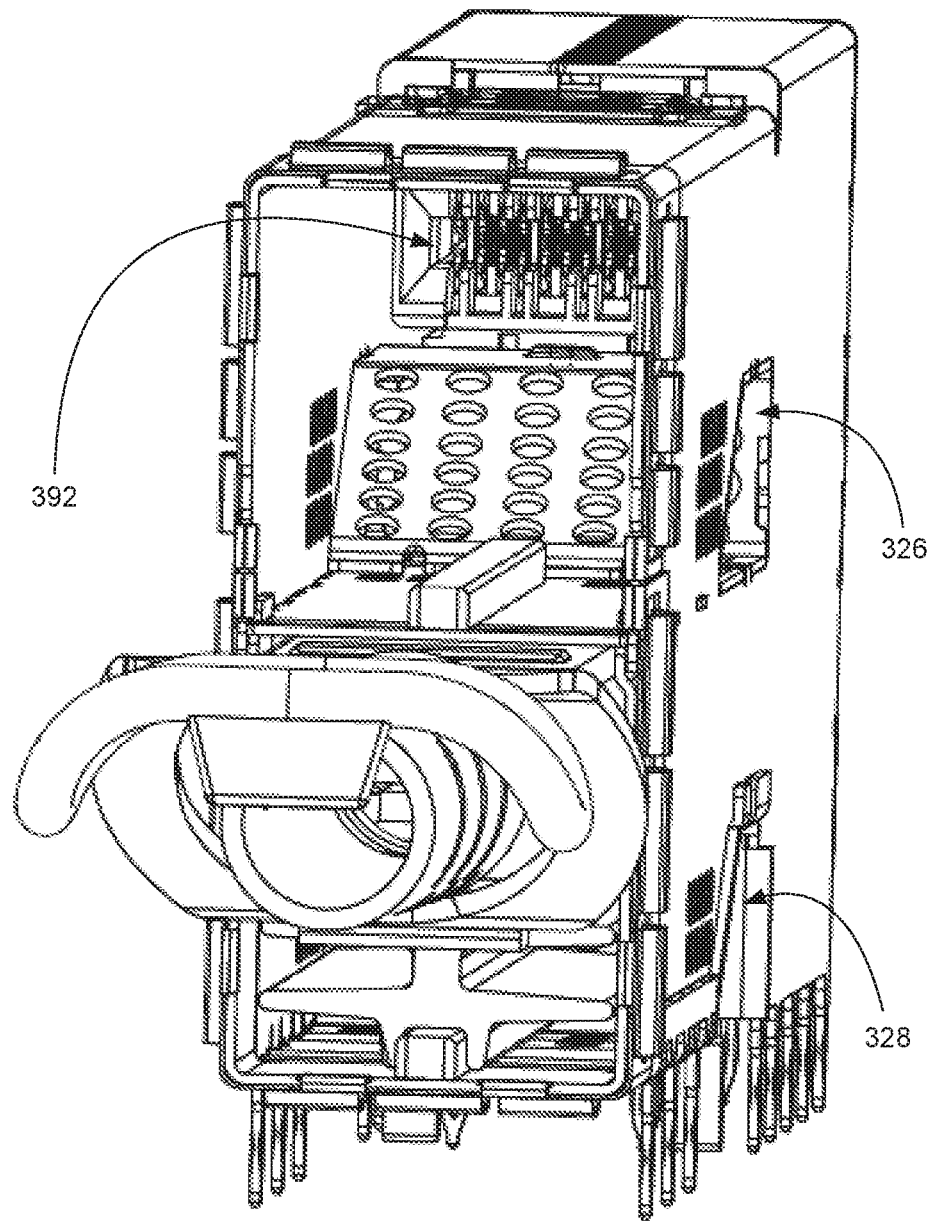
FIG. 43 illustrates another perspective view of the embodiment depicted in FIG. 41.
Figure 44:
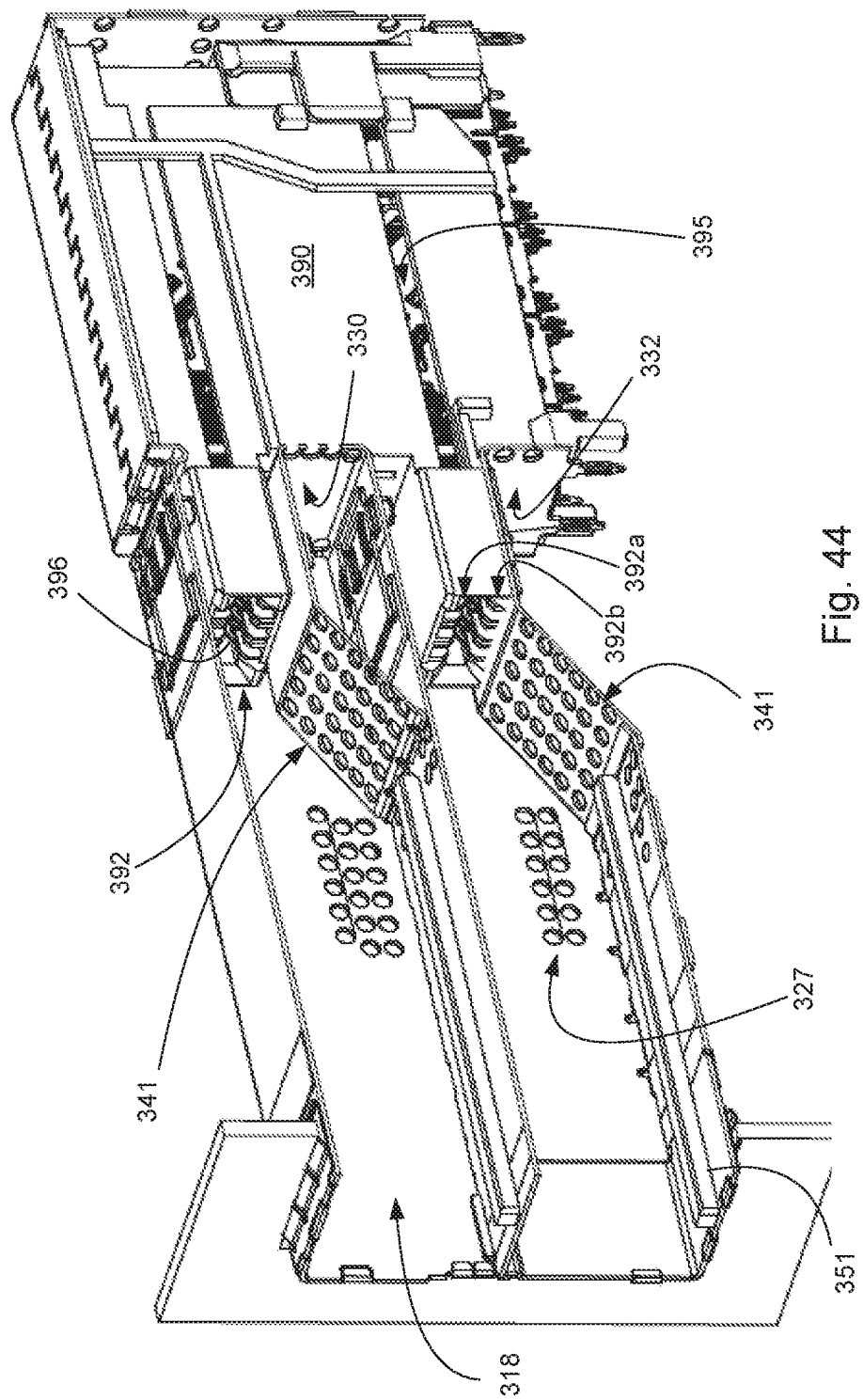
FIG. 44 illustrates a perspective view of a cross-section taken along line 43-43 in FIG. 40 but with the modules removed for purposes of illustration.
Figure 45:
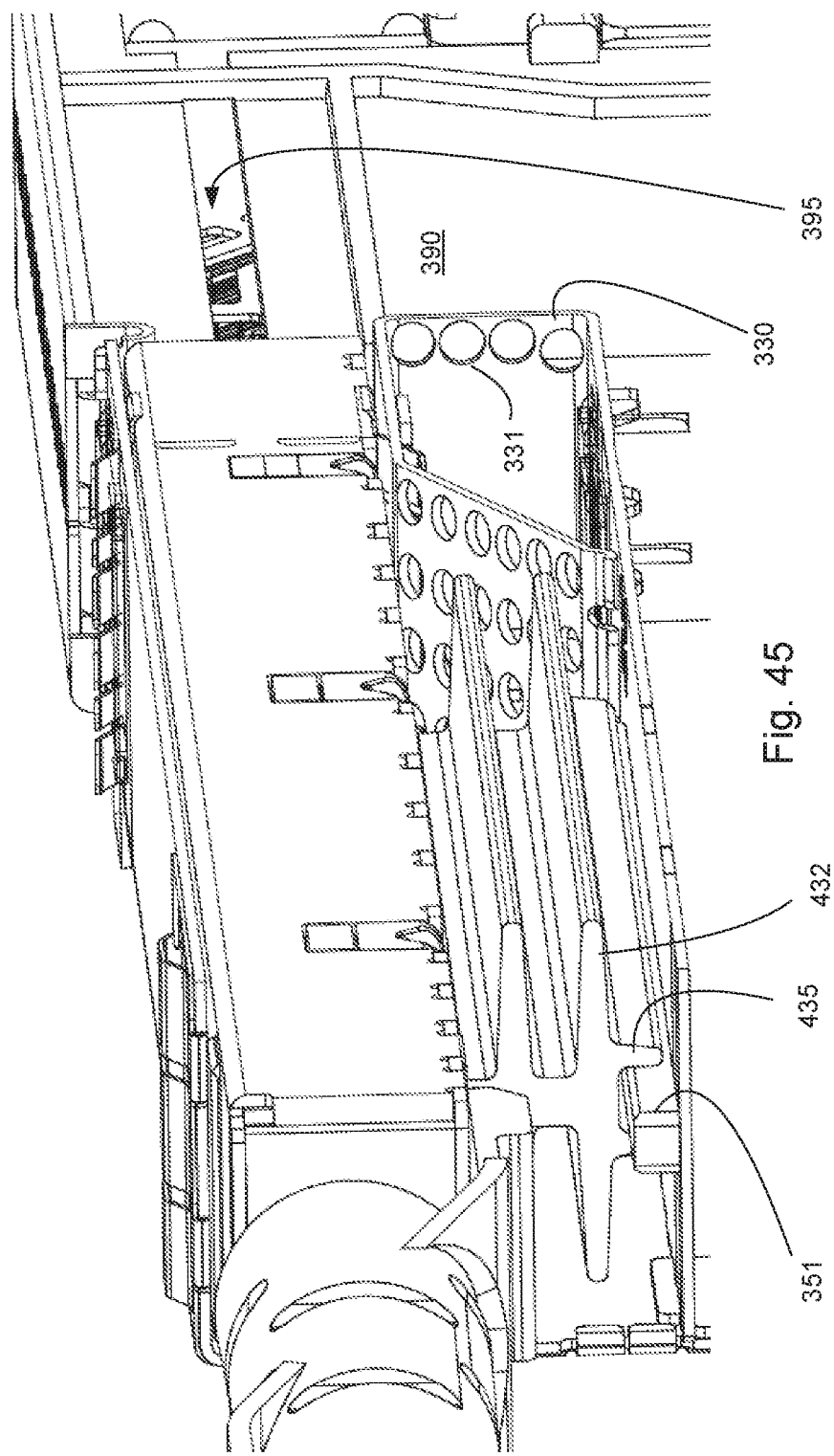
FIG. 45 illustrates an enlarged perspective view of the embodiment depicted in FIG. 44 but with a module added for purposes of illustration.
Figure 46:
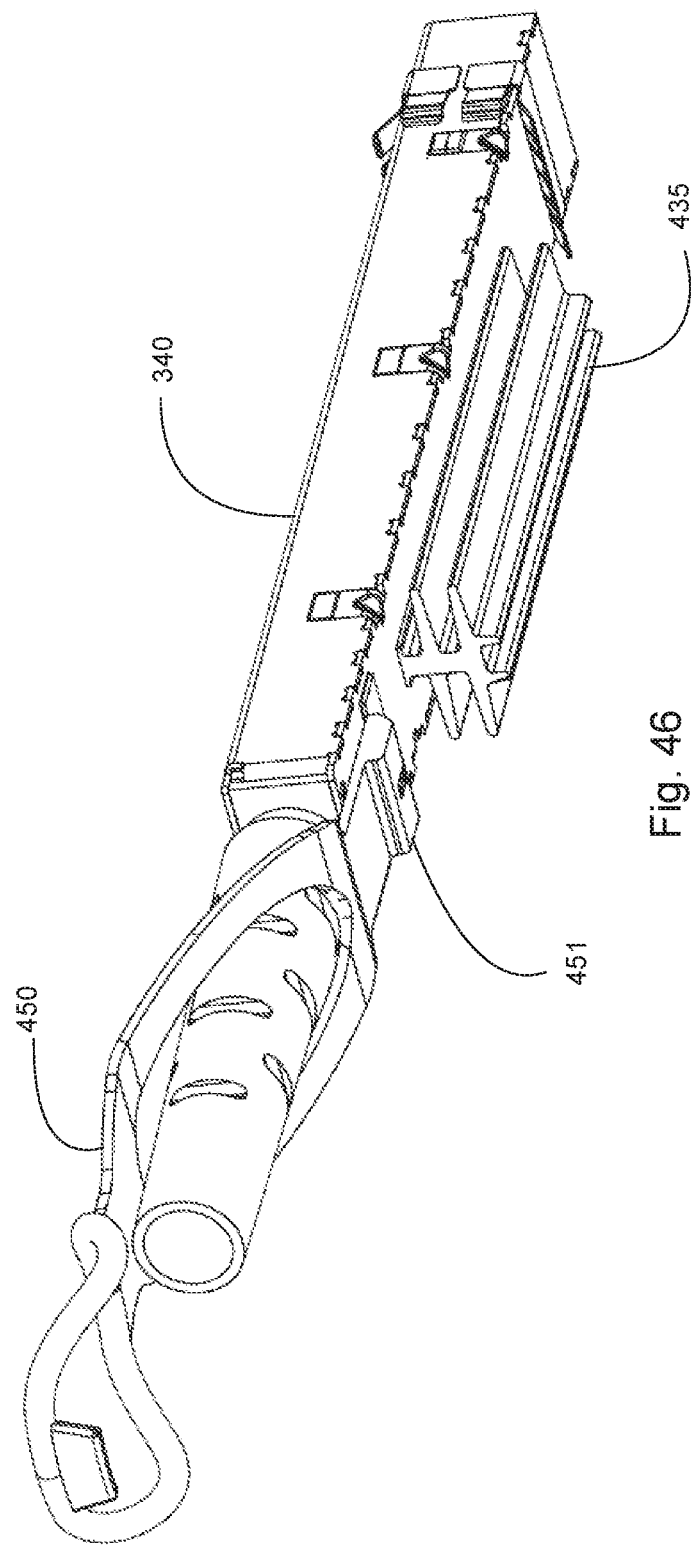
FIG. 46 illustrates a perspective view of an embodiment of a module with a single thermal dissipation system.

As depicted in FIG. 34, the sliding chassis 160 includes cross beams 168 to help control the position of the sliding chassis 160 in the body 140. As can be appreciated, the sliding chassis 160 receives a force that is applied on the second side 140b of the body 140 and is mechanically connected to fingers 167 that are on the first side 140a of the body 140. Accordingly, the depicted system allows a force exerted by a user on a first side of the module to be applied to the leg 169 of the sliding chassis 160, which is on a second side of the module, and the sliding chassis 160 directs the force to fingers 167 that are on the first side of the module.

As noted above, the ports 218 are ganged and stacked. To provide good electrical performance, mid wall 229a can be provided to help improve electromagnetic interference (EMI) performance. A connector 290 is positioned between the mid wall 229a and the rear wall 223.

Figure 19:
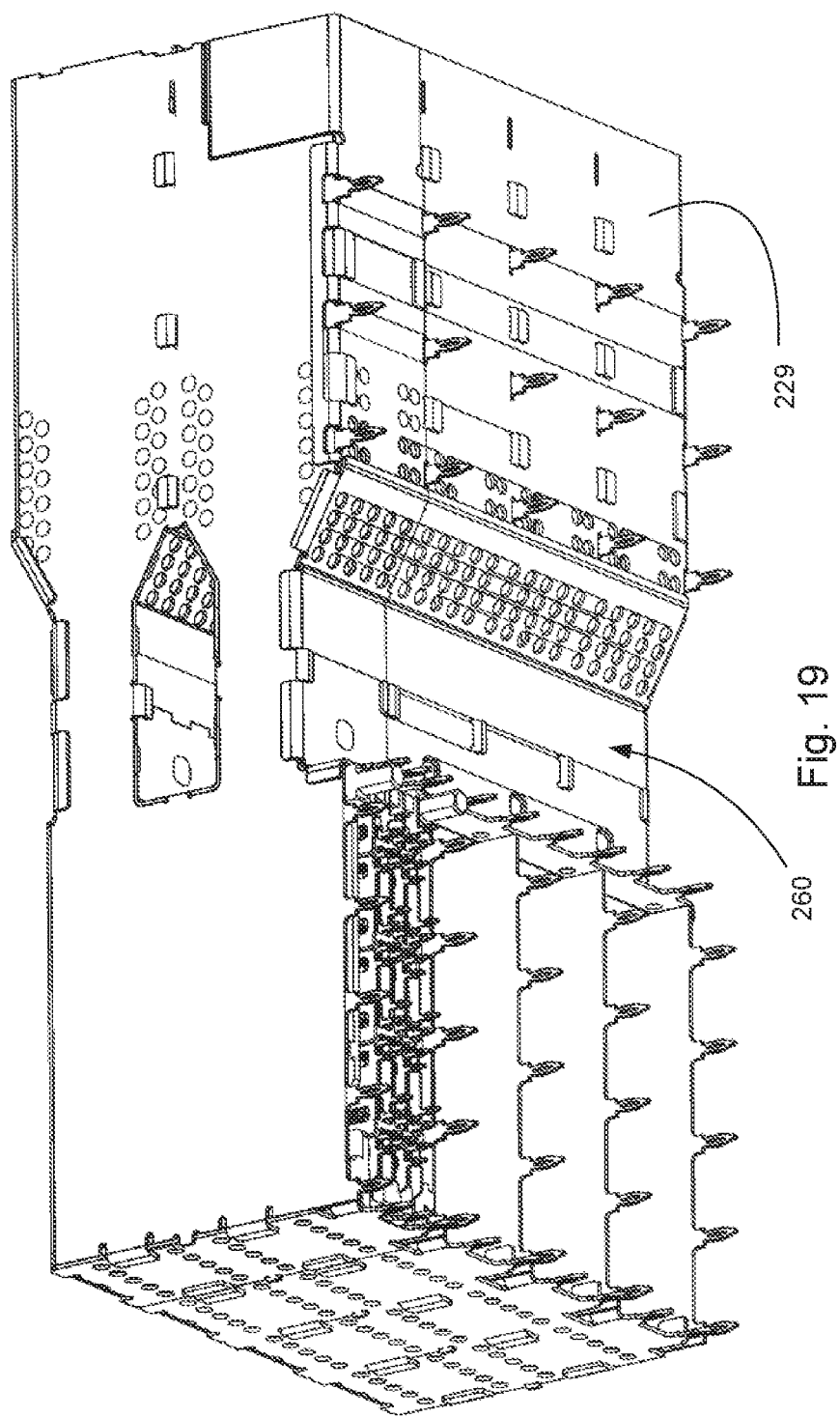
FIG. 19 illustrates another perspective view of the embodiment depicted in FIG. 16 with the PCB removed for purposes of clarity.
Figure 20:
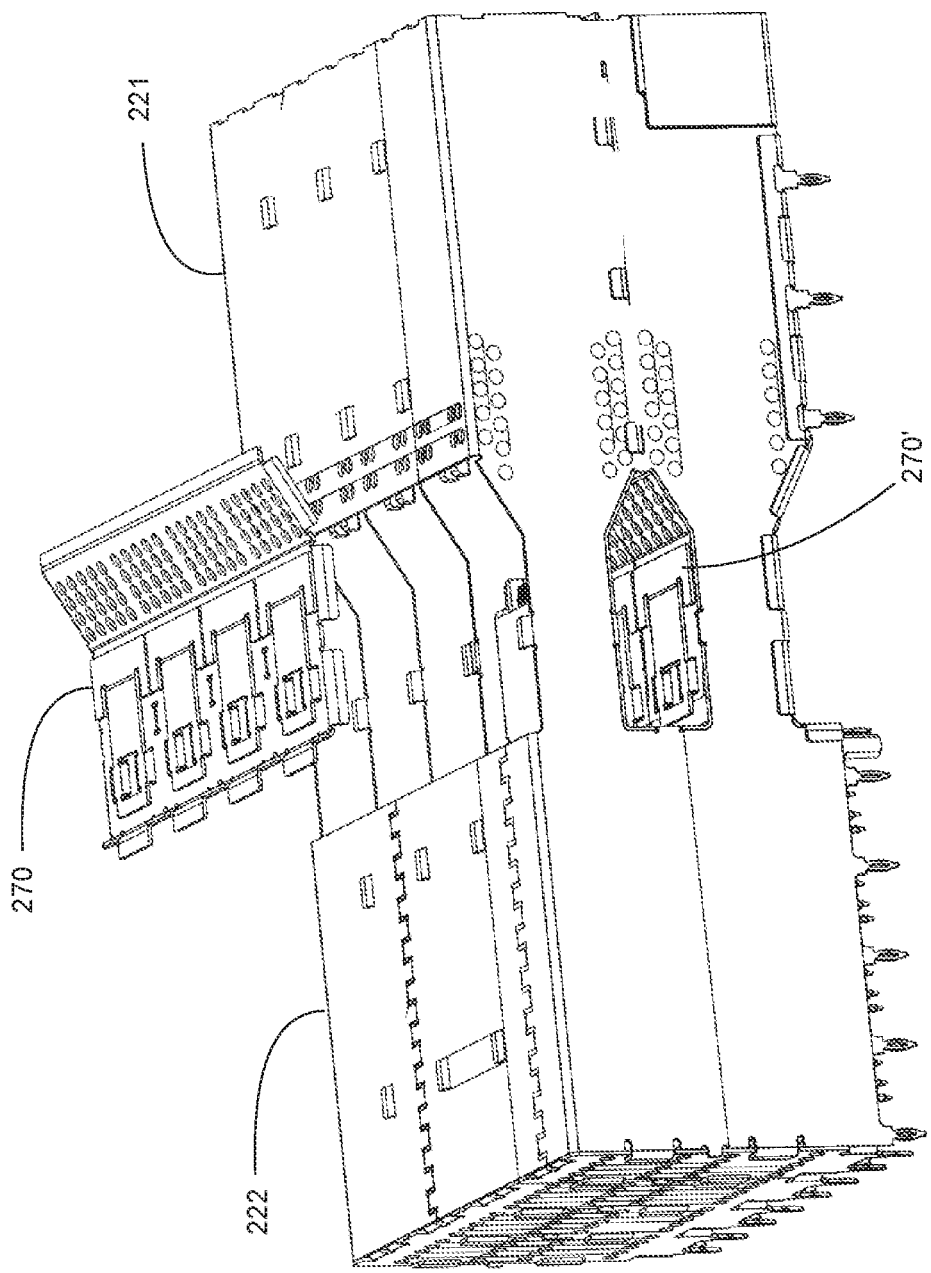
FIG. 20 illustrates a partially exploded perspective view of the embodiment depicted in FIG. 16.
Figure 21:
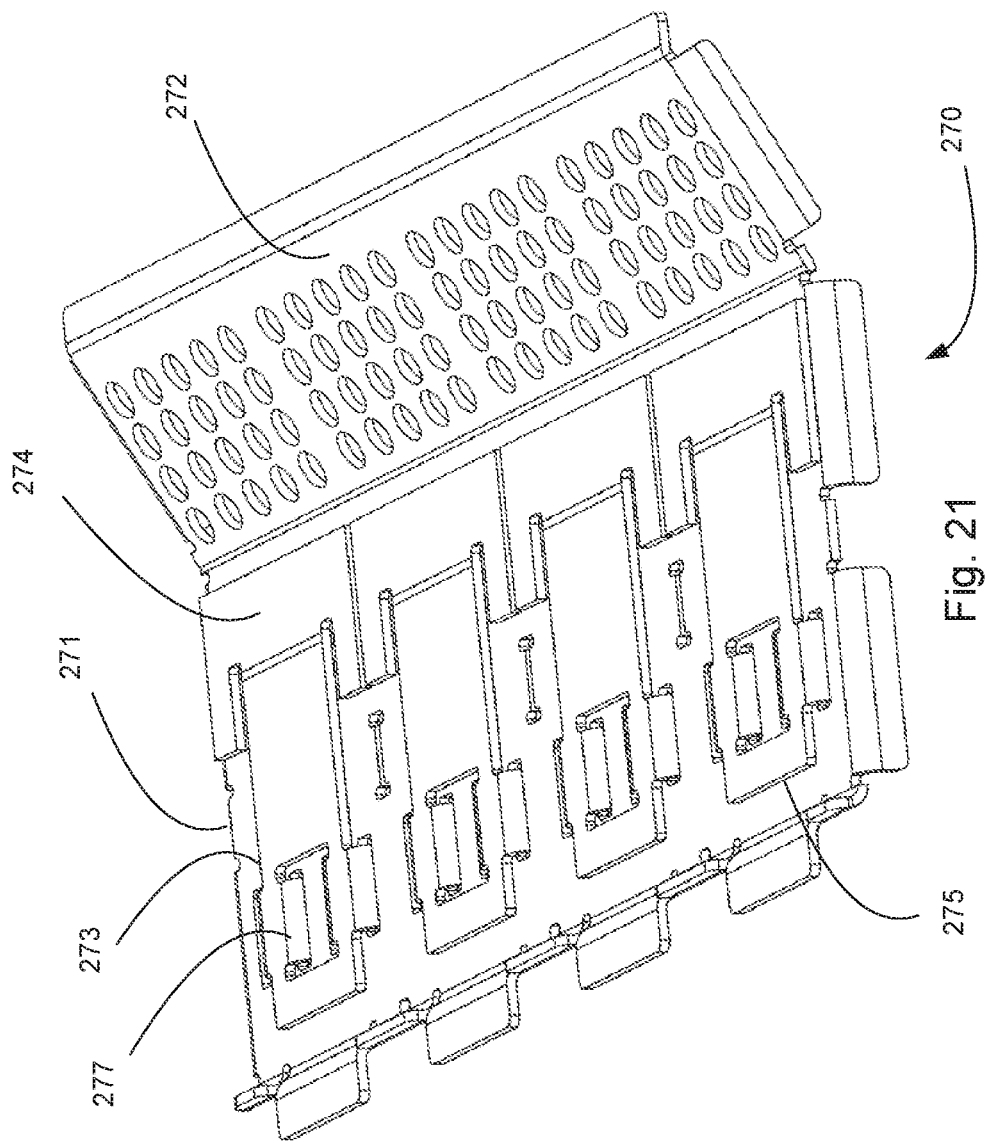
FIG. 21 illustrates a perspective view of an embodiment of a latching member.
Figure 22:
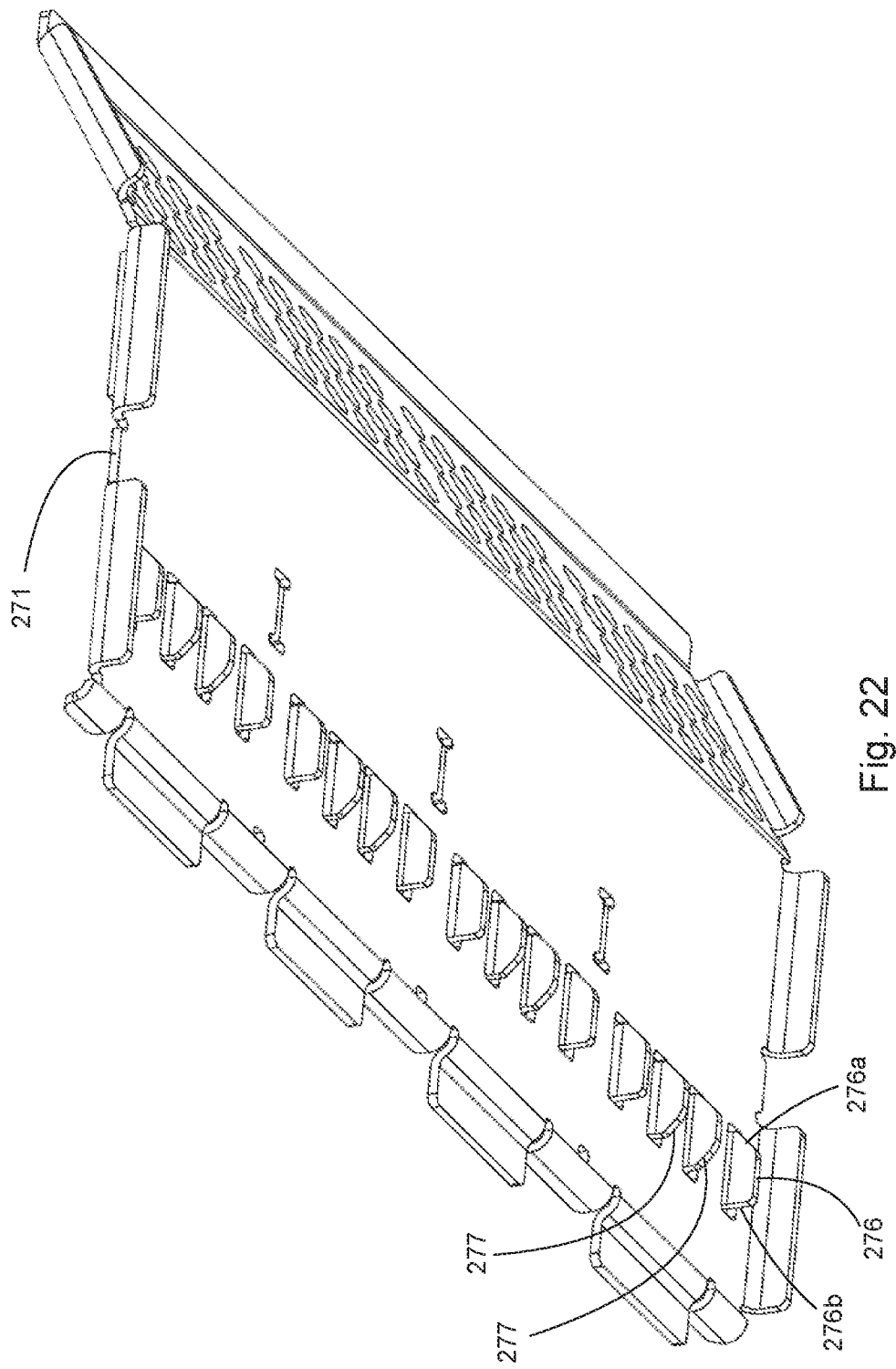
FIG. 22 illustrates another perspective view of the embodiment of a latching member depicted in FIG. 21.
Figure 23:
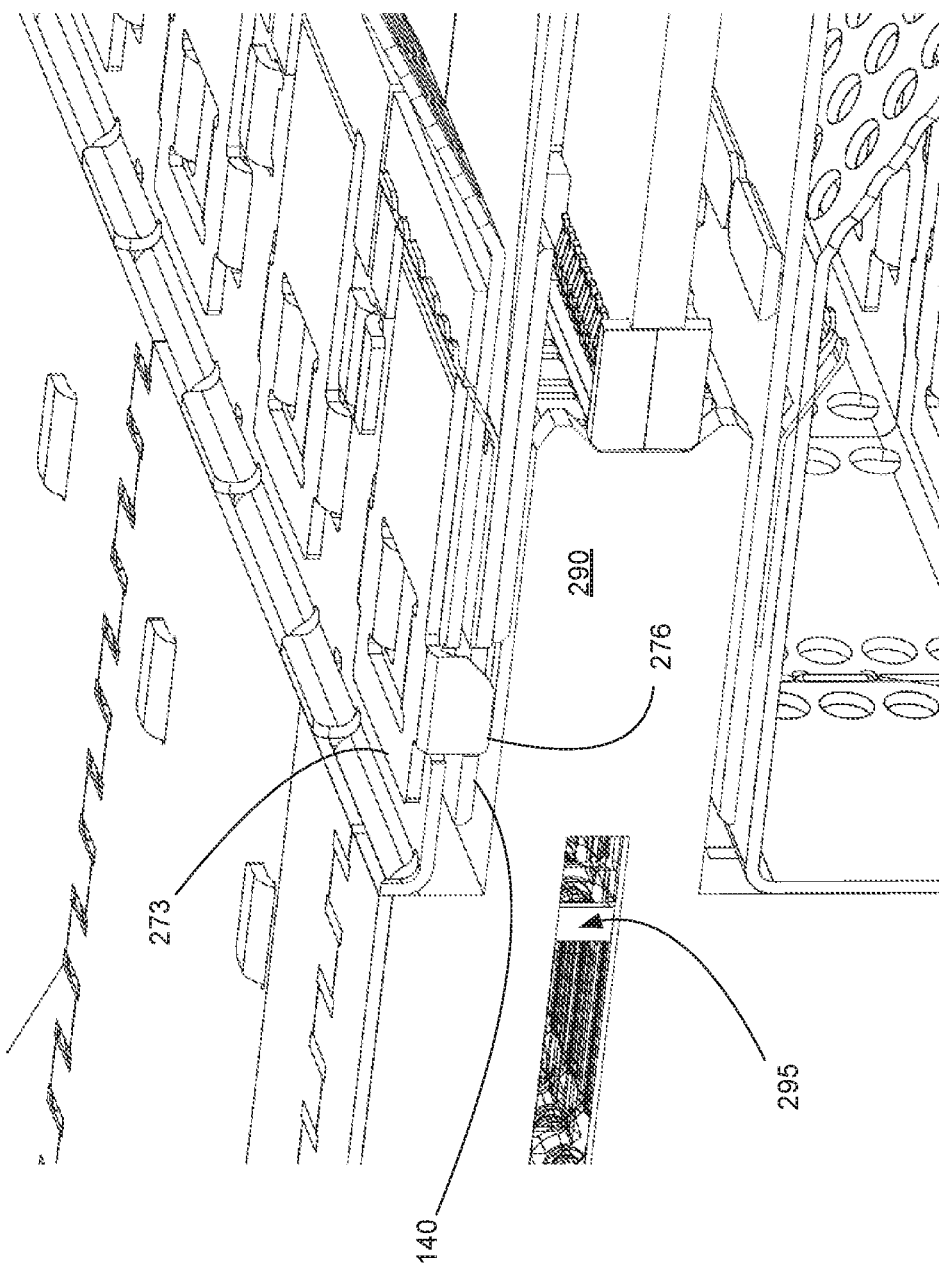
FIG. 23 illustrates an enlarged, partial perspective view of a cross section of an embodiment of a module mated with a receptacle, taken along line 23-23 in FIG. 16.
Figure 24:
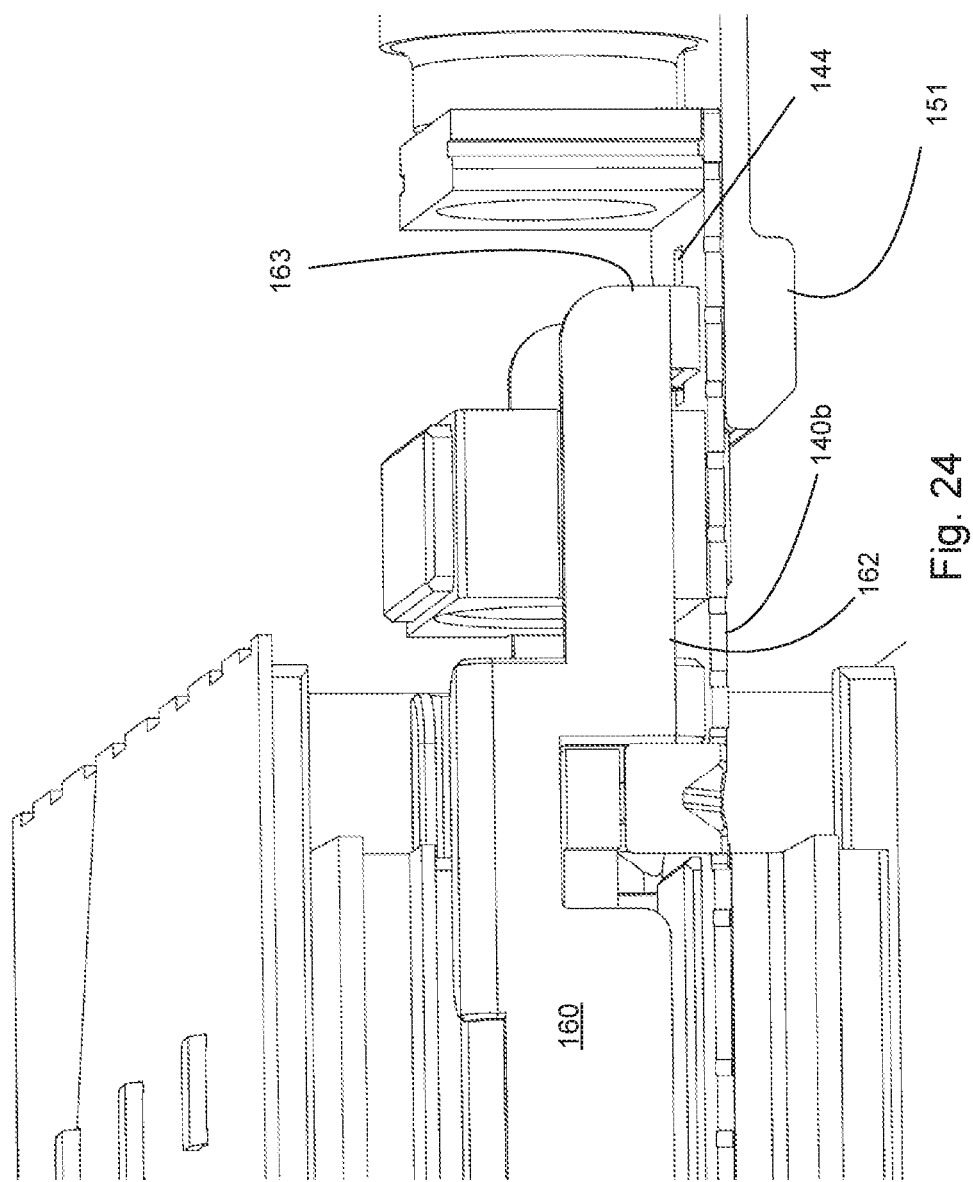
FIG. 24 illustrates a partial perspective enlarged view of an embodiment of a module with a sliding chassis.
Figure 25:
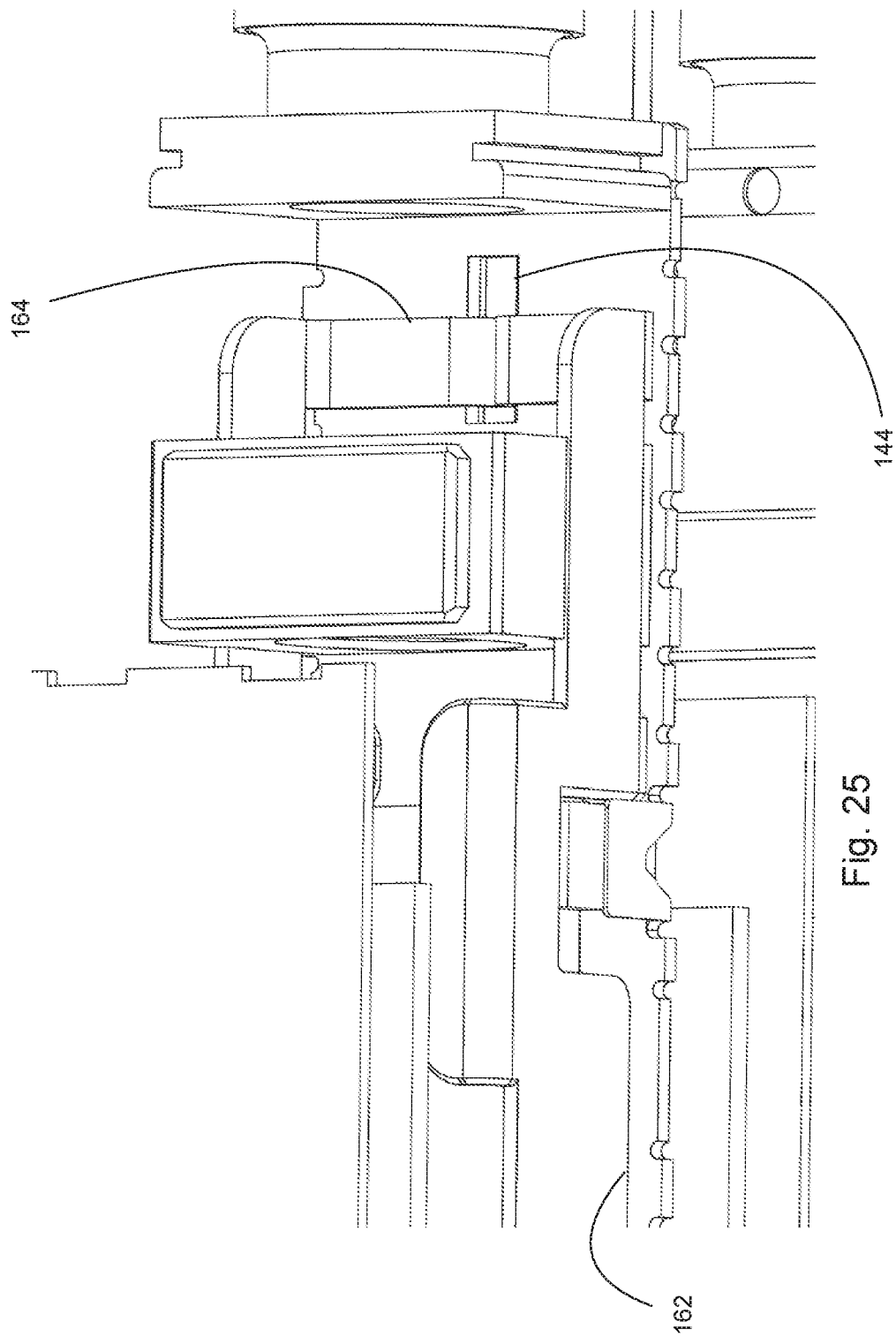
FIG. 25 illustrates another perspective view of an embodiment depicted in FIG. 24.
Figure 26:
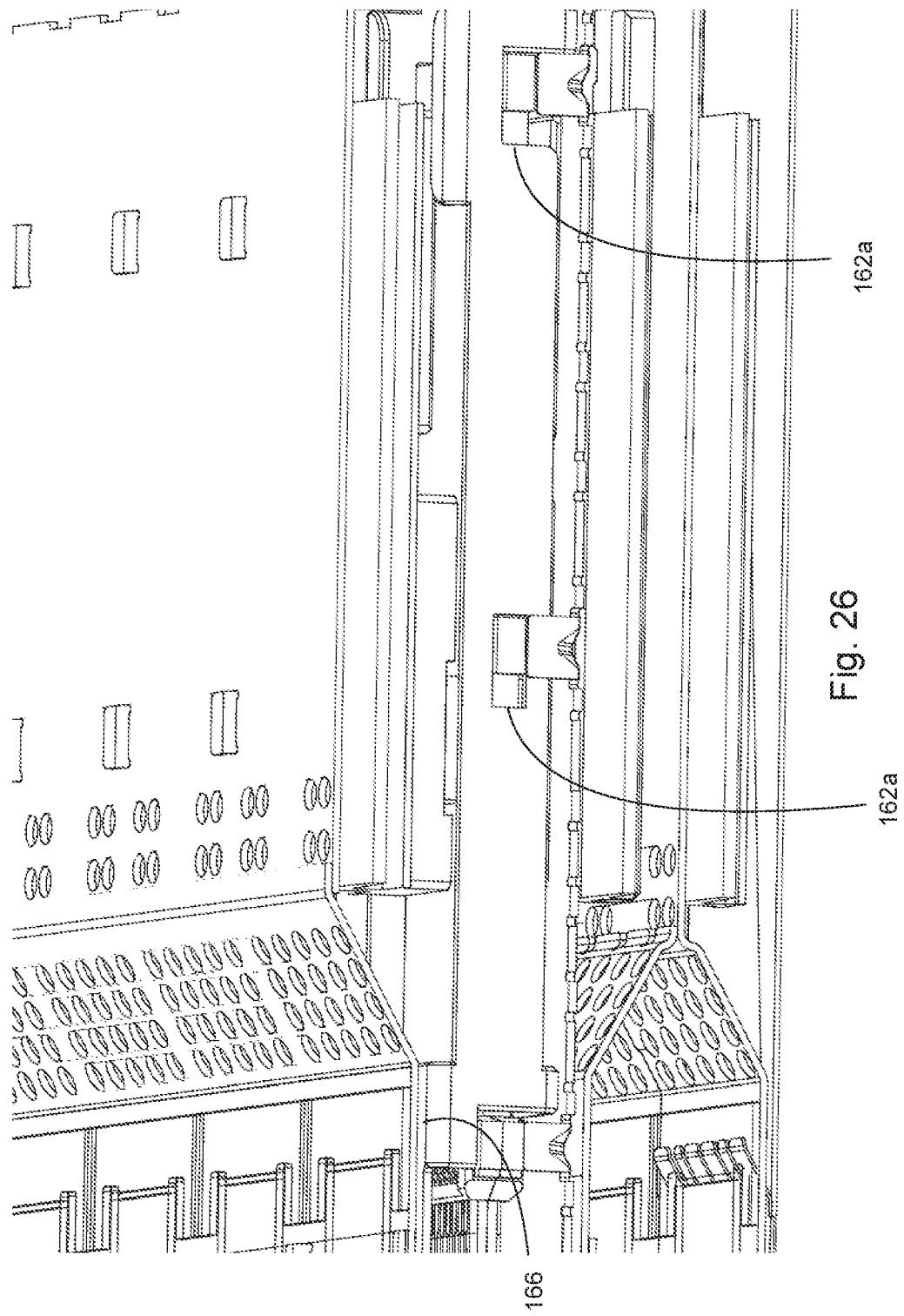
FIG. 26 illustrates an enlarged perspective view of another portion of the sliding chassis depicted in FIG. 24
Figure 27:
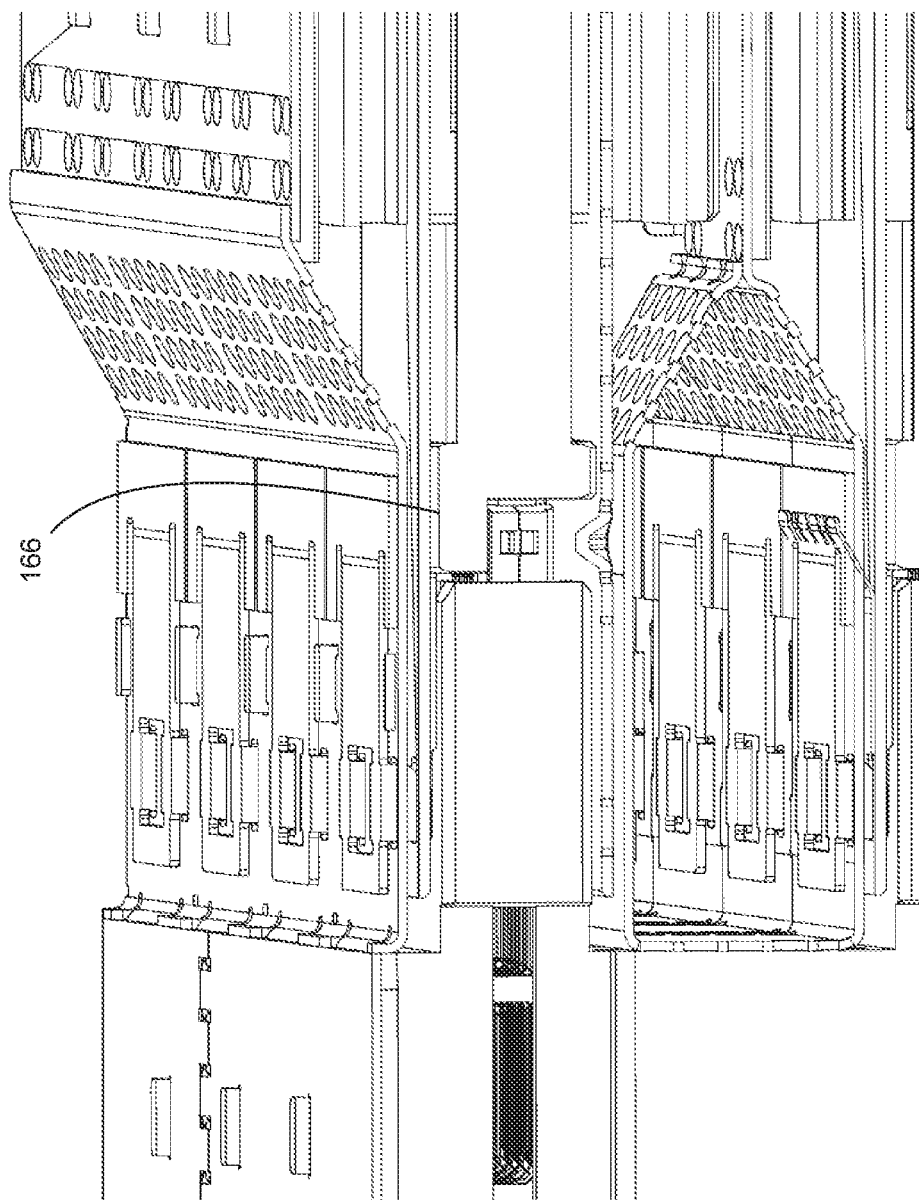
FIG. 27 illustrates an enlarged perspective view of the embodiment depicted in FIG. 26.
Figure 28:
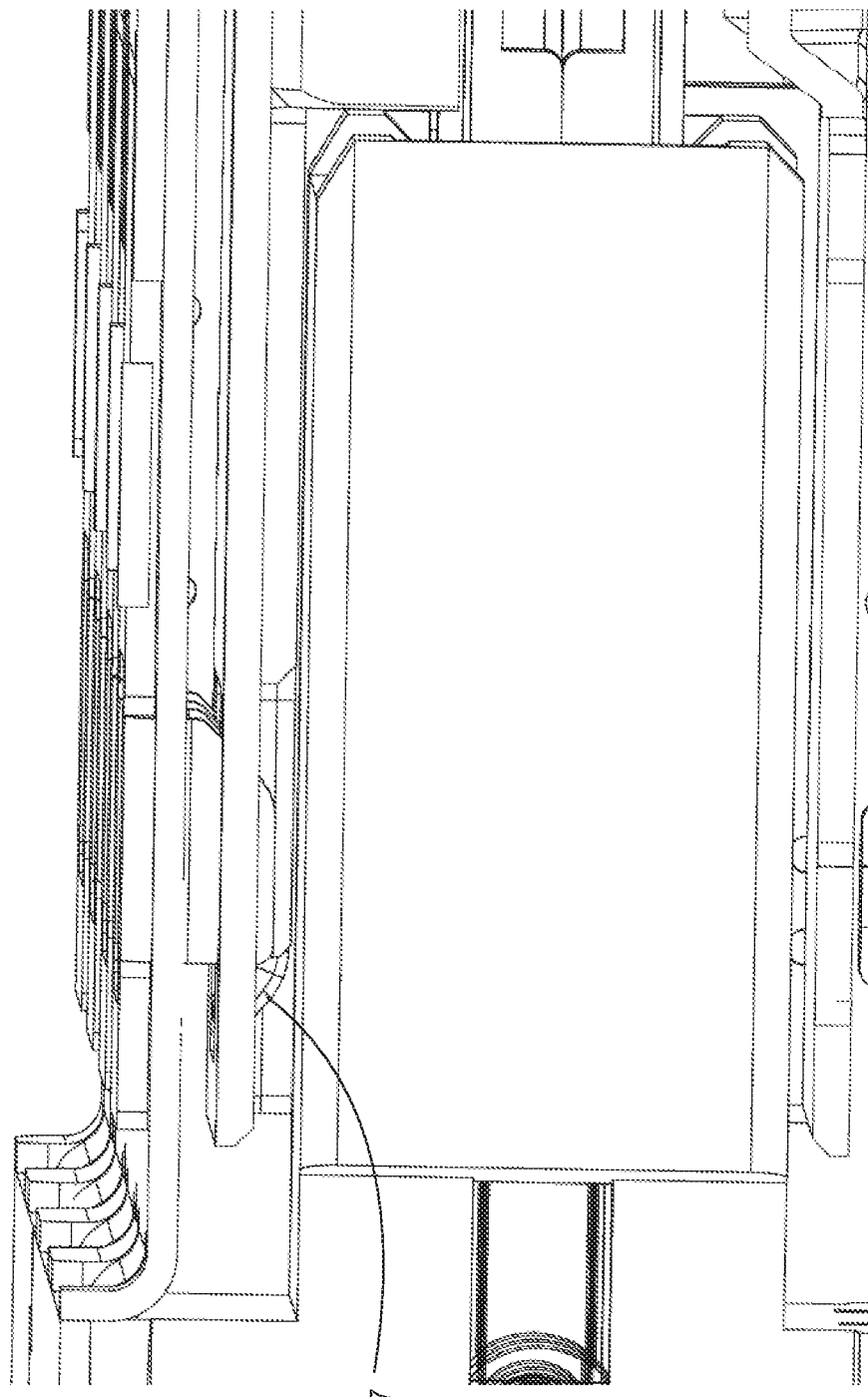
FIG. 28 illustrates an enlarged perspective view of the embodiment depicted in FIG. 27.
Figure 29:
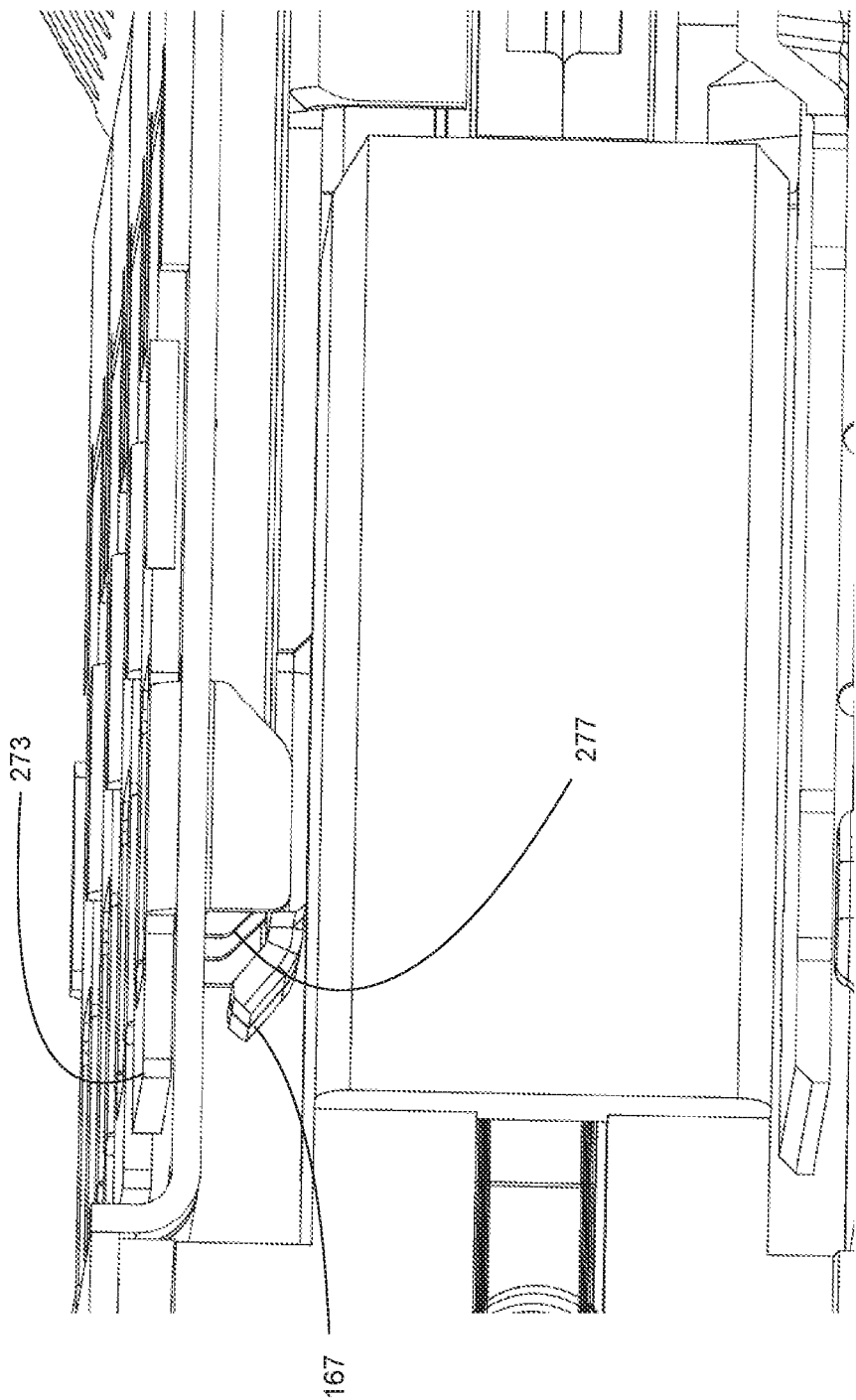
FIG. 29 illustrates a simplified perspective view of the embodiment depicted in FIG. 28.
Figure 30:
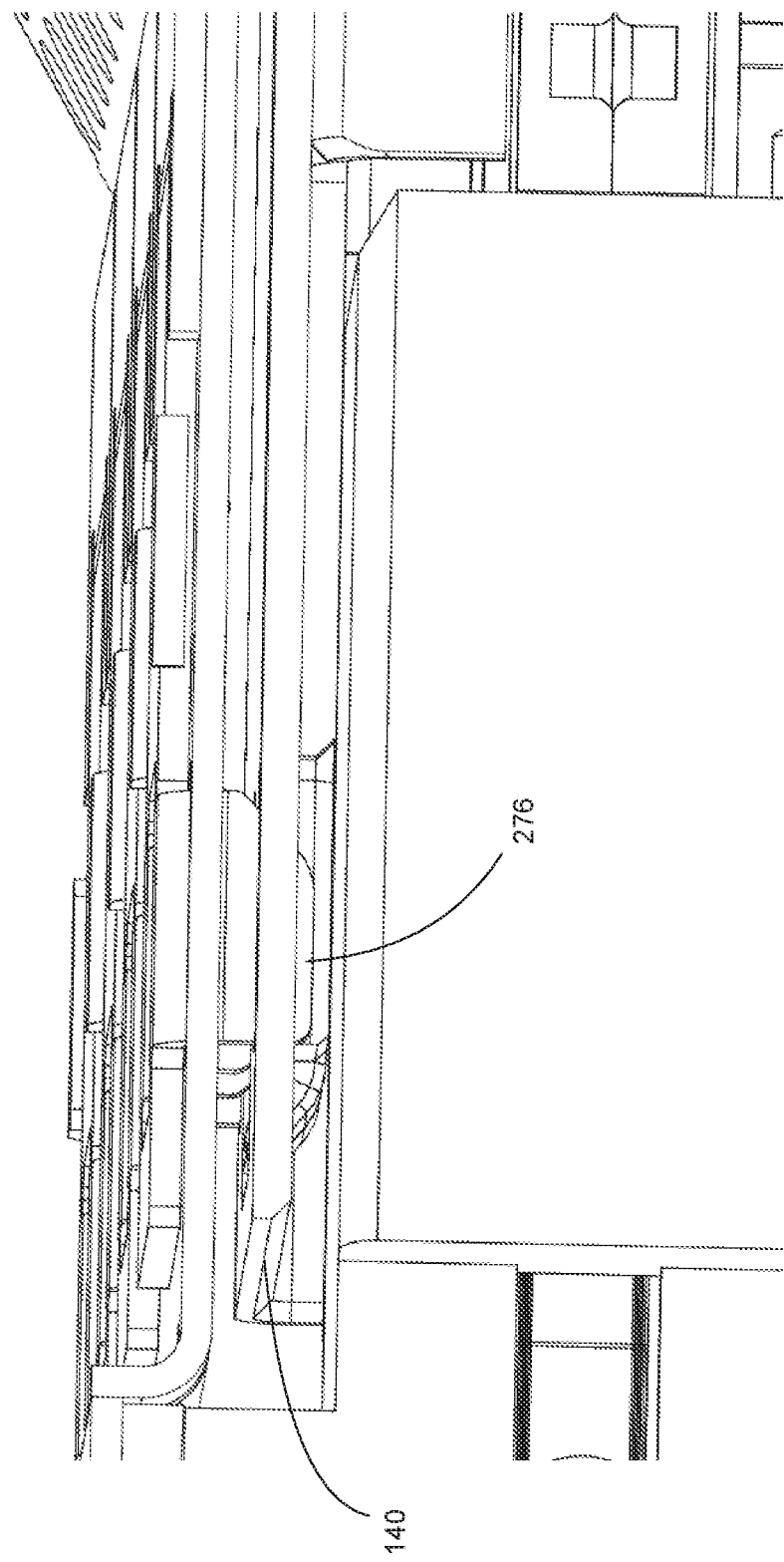
FIG. 30 illustrates another perspective view of the embodiment depicted in FIG. 28.
Figure 31:
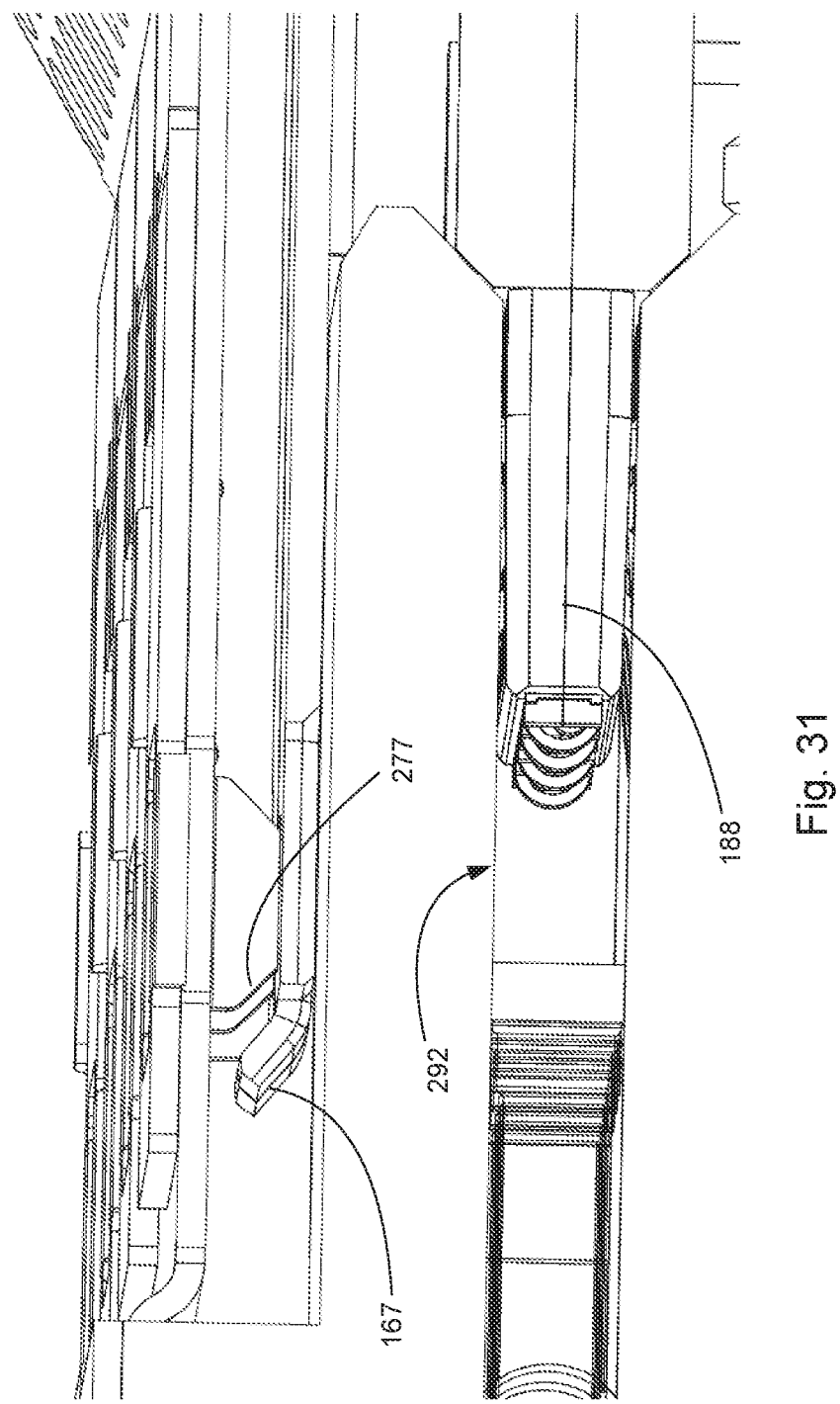
FIG. 31 illustrates another perspective view of the embodiment depicted in FIG. 29.
Figure 32:
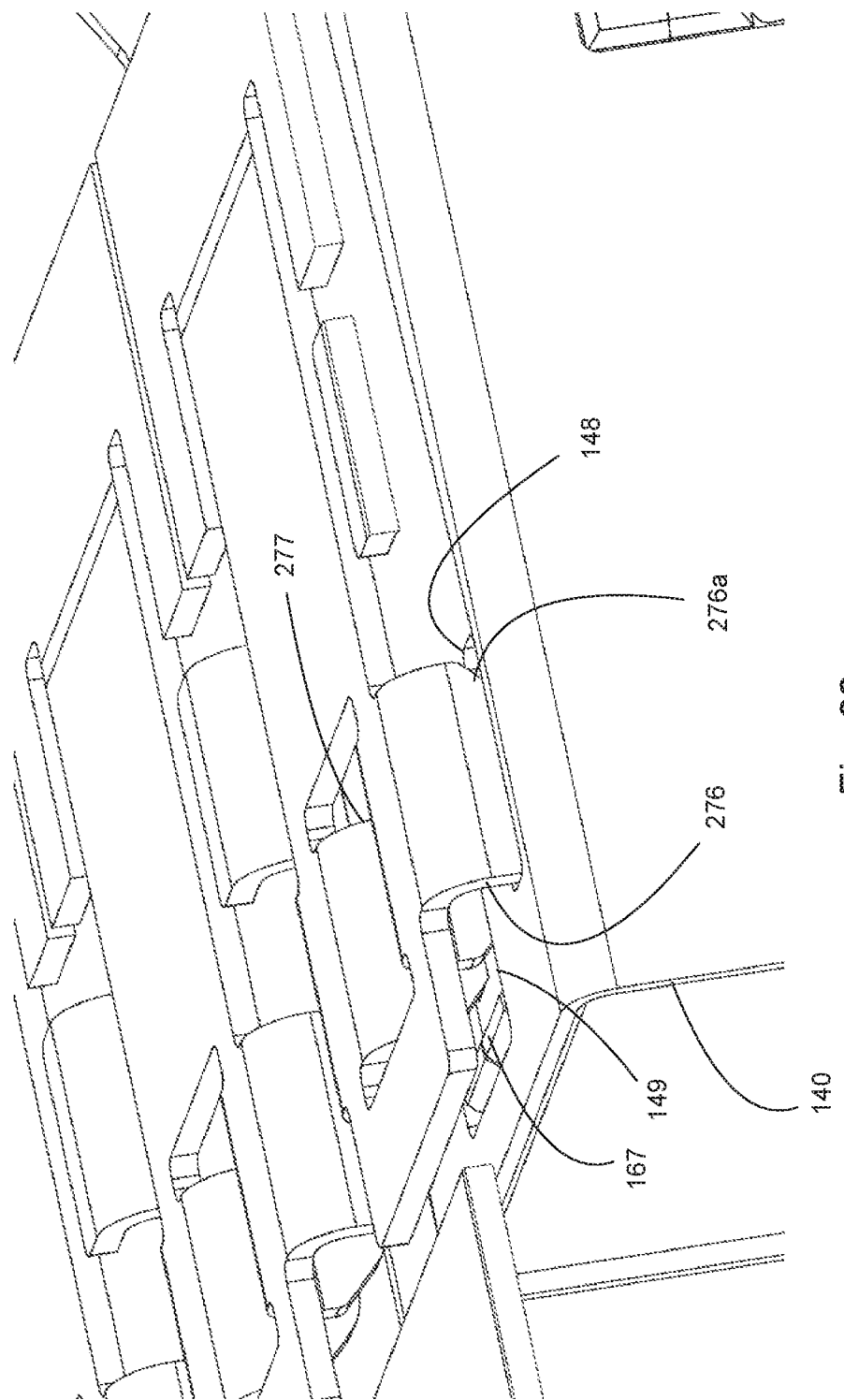
FIG. 32 illustrates a perspective simplified view of an embodiment of a latching member engaging a module.
Figure 33:
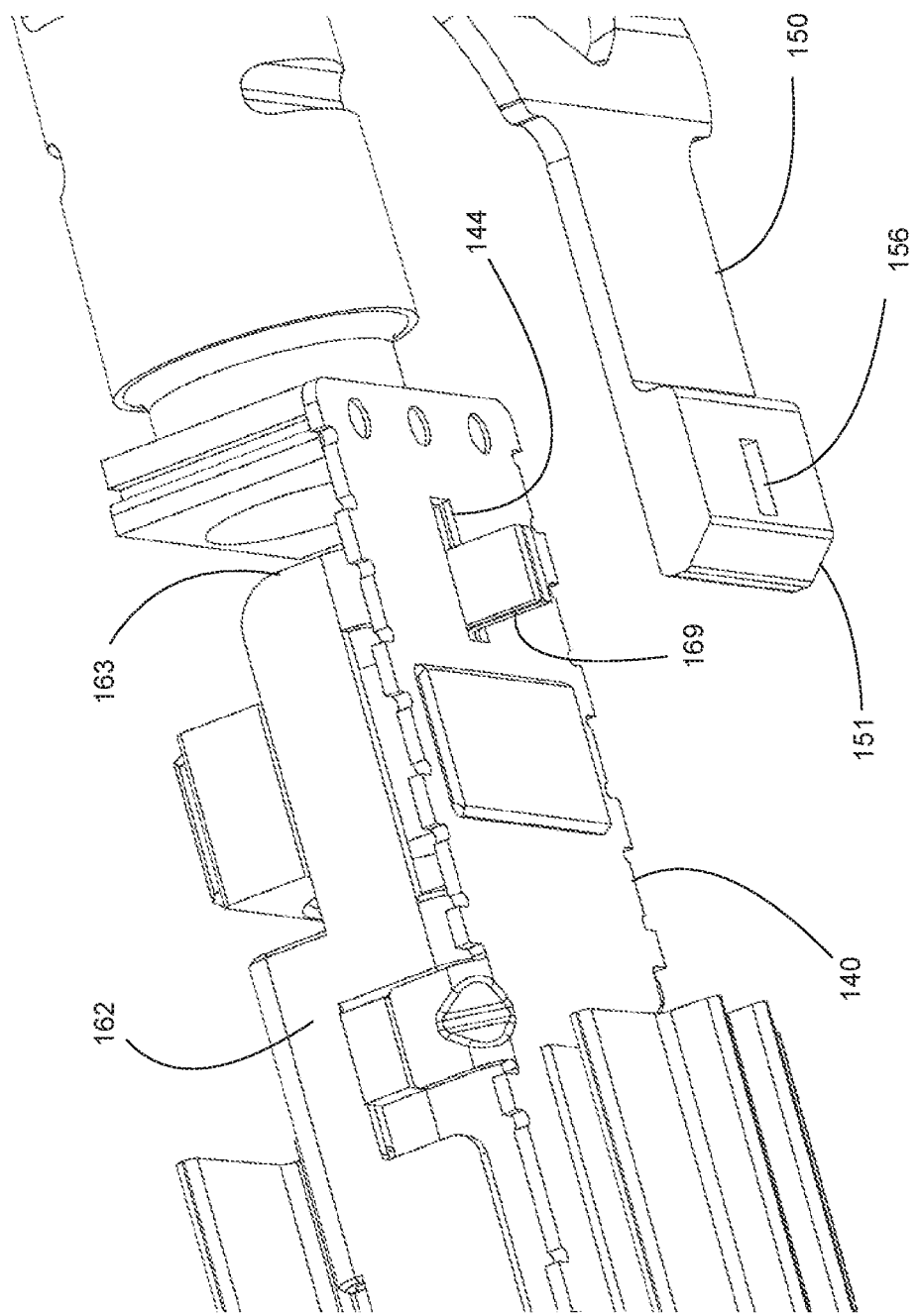
FIG. 33 illustrates a partially exploded simplified perspective view of an embodiment of a module.

One benefit of the depicted stacked and ganged design is that even with a 2×4 system it is possible to cool the inner ports. It should be noted, however, that the total number of ports that can be cooled is limited by the size of the side opening in the cage. Preferably the area of the side opening is equal to or greater than the open area of the vent walls at the back of the port that feed the side openings. Otherwise, if the side opening is undersized then the side opening will act to limit the air flow through the ports, thus reducing the cooling capability of the system. For example, if the open area of the vent walls at the back of the port is x and there are four ports in a row, the area of the side opening is preferably equal to or greater than 2x (it being understood that air flowing through the left two ports can go out the left side opening and the air flowing through the right two ports can go out the right side opening). If two stacked ports both have vent areas that are in communication with a single side opening (such as is depicted in FIG. 19) such that the combine vent area is Y, then in a 2×4 configuration the side opening preferably will have an area greater than or equal to 2Y. Of course, it is possible to have configurations where the side opening is less than two times the area of the thermal vents but then the side opening will tend to act as the limiting factor for air flow and such a configuration is less desirable from a thermal performance standpoint.

It can be appreciated from the Figures that if there is sufficient space, some air can pass along the housing and be directed past the housing and out the back of the back. Such a construction is not required but can provide reduced air flow resistance and thus improve the performance of the system, potentially allowing for a smaller side opening. For example, some air can flow into apertures 231, 233 in back walls 230, 232. Air can then flow along channel 294 and out rear apertures 293a in the rear wall 293.

It should be noted that as depicted, the system in FIGS. 1-13B illustrate ports with thermal channels on two sides of the module, the thermal channels extending from a front face of the port to the corresponding thermal vent at the back of the port. This has been determined beneficial when high levels of thermal performance are desired and/or it is beneficial to cool both sides of the module. In an alternative embodiment where it is less beneficial to cool both sides of the module, the thermal dissipation system could be positioned on one side of the module (e.g., the module could have a thermal dissipation system only on one side). A system with such a construction is depicted in FIGS. 40-46. As can be appreciated, the module includes fins on one side and includes a rail on the module that engages a rail provided in the port. However, the port avoids the rail on both sides and instead just includes a rail on a single side of the port. The orientation of the module can be controlled by the tolerance of the module and the cage, along with the rail. Naturally, as discussed above, even the rails on the one side of the port/module could be omitted and a module with just fins on one side could be provided.

The module is expected to have an energy consumption device as purely passive devices tend not to need cooling in order to function. Examples of energy consumption devices include, without limitation, amplifiers for boosting the signal (thus allowing for active copper cables) and electro-optical chips that convert electrical signals to optical signals and/or optical signals to electrical signals (allowing for optical modules). Energy consumption devices are not 100 percent efficient and thus generate heat during operation. It is expected that most modules will have an energy consumption device that, in operation, will generate at least 0.5 watts of heat energy and more likely will generate heat energy of greater than 1 watt. The depicted system, depending on air flow and the predetermined acceptable temperature range, may be suitable for systems where the module generates more than 4 watts of heat energy.

As depicted in the embodiments discussed above, there is a side opening in the cage that allows air to pass through the ports, out the vent walls and out of the side openings. The embodiments discussed in FIGS. 1-39 have fins on two sides of the module. In an alternative embodiment sufficient surface area (e.g., additional fins) can be provided on one side of the module, as illustrated in FIGS. 40-46. While only one thermal dissipation system is provided, the cage structure and the housing illustrated in FIGS. 40-46 can be similar to embodiments discussed above and illustrated in FIGS. 1-39.

The connector system 310 includes a receptacle 315 that includes a cage 320 and a housing 390. The cage includes side walls 324a, 324b, top wall 322 and rear wall 323. If desired a bottom wall 329 can also be provided. The housing 390 supports a wafer set 395 that provides terminals 396 in card slots 392. The terminals 396 can be arranged in rows 392a, 292b on both sides of the card slot 392.

The module 400 includes a body 440 that has a thermal dissipation system 430 extending from one side. The thermal dissipation system 430 includes an optional rail 435 that is configured to engage rail 351 of the receptacle 315. A latching member 370 is configured similar to latching system 270 and thus will not be discussed in detail.

To provide cooling, air can flow into the port 318, over fins 432, through the vent wall 341 and out the side opening 326, 328. If desired, the back wall 330, 332 of the side openings 326, 328 can include apertures 331, 333 that allow air to flow along the side of the housing 390 and out rear apertures 323a in rear wall 323. The cage can also include side apertures 327 to provide further cooling. The module 400 can include a sliding chassis similar to the sliding chassis discussed above with respect to module 100 and thus can include the pull tab 450 that has a pull block 451 that is mechanically connected to the sliding chassis (which is not shown again for purposes of brevity).

It should be noted that the depicted embodiments are directed toward receptacles with stacked ports. While a stacked port configuration is beneficial from a density standpoint, it is not required. Thus, the depicted features of the thermal channel (and the module) could also be used with a receptacle that is a 1×N configuration (e.g., is not stacked). Such a receptacle could have a vent wall above a card slot, below a card slot, or on both sides of the card slot (as desired and as is appropriate to provide the desired air flow).

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

I claim:

1. A receptacle comprising:
   a plurality of structures that support a plurality of terminals;
   a housing positioned around the plurality of structures and the plurality of terminals, the housing having an air channel;
   a first card slot;
   a second card slot;
   a cage positioned around the housing, the first card slot and the second card slot, the cage having a rear wall with rear apertures and a side wall with side apertures, the cage defining a first port aligned with the first card slot and a second port aligned with the second card slot, wherein the cage is configured so that air may flow directly from at least one of a front face of the first port and the side apertures of the side wall through the air channel and out the rear apertures of the rear wall.

2. The receptacle of claim 1, wherein the housing forms the first card slot.

3. The receptacle of claim 1, wherein the housing forms the second card slot.

4. The receptacle of claim 1, wherein the air channel extends from a front side of the housing to a back side of the housing.

5. The receptacle of claim 1, wherein the air channel is formed by an opening in a front side of the housing and an opening in a back side of the housing.

6. The receptacle of claim 5, wherein at least some of the plurality of structures have openings in communication with the opening in the front side of the housing and the opening in the back side of the housing.

* * * * *